(12) United States Patent
Yang et al.

(10) Patent No.: US 12,300,154 B2
(45) Date of Patent: May 13, 2025

(54) DISPLAY APPARATUS AND ELECTRONIC DEVICE

(71) Applicant: Huawei Technologies Co., Ltd., Shenzhen (CN)

(72) Inventors: Sulin Yang, Dongguan (CN); Yapeng Li, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 93 days.

(21) Appl. No.: 18/253,108

(22) PCT Filed: Nov. 12, 2021

(86) PCT No.: PCT/CN2021/130231
§ 371 (c)(1),
(2) Date: May 16, 2023

(87) PCT Pub. No.: WO2022/100683
PCT Pub. Date: May 19, 2022

(65) Prior Publication Data
US 2023/0419884 A1 Dec. 28, 2023

(30) Foreign Application Priority Data
Nov. 16, 2020 (CN) .......................... 202011278396.8

(51) Int. Cl.
*G09G 3/32* (2016.01)
(52) U.S. Cl.
CPC ........ *G09G 3/32* (2013.01); *G09G 2300/0408* (2013.01); *G09G 2330/021* (2013.01); *G09G 2360/144* (2013.01)

(58) Field of Classification Search
CPC ........ H10K 59/13; G09G 3/3233; G09G 3/32; G09G 2300/0408; G09G 2300/0861; G09G 2330/021; G09G 2300/0842; G09G 2360/144
See application file for complete search history.

(56) References Cited

U.S. PATENT DOCUMENTS 9,041,697 B2 * 5/2015 Soto .................. G02F 1/133603
345/207
2016/0021722 A1 1/2016 Soto

FOREIGN PATENT DOCUMENTS

| CN | 1608281 A | 4/2005 |
|---|---|---|
| CN | 109887965 A | 6/2019 |
| CN | 111106152 A | 5/2020 |
| CN | 111681605 A | 9/2020 |
| KR | 102173203 B1 | 11/2020 |

* cited by examiner

*Primary Examiner* — Deeprose Subedi
(74) *Attorney, Agent, or Firm* — Conley Rose, P.C.

(57) ABSTRACT

A display panel includes a substrate, a photoelectric detector, and a display surface. The photoelectric detector is located on a side that is of the substrate and that is close to the display surface. The photoelectric detector includes a PN junction or a PIN junction. The photoelectric detector is configured to be reverse biased or zero biased when the display apparatus works in an ambient light detection stage to generate a photo-generated current under illumination of ambient light and detect ambient light information. The photoelectric detector is disposed above the substrate, and ambient light needs to penetrate only a part of a film layer structure of the display panel to be received by the photoelectric detector.

20 Claims, 15 Drawing Sheets

DISPLAY APPARATUS AND ELECTRONIC DEVICE

CROSS-REFERENCE TO RELATED APPLICATIONS

This is a U.S. National Stage of International Patent Application No. PCT/CN2021/130231, filed on Nov. 12, 2021, which claims priority to Chinese Patent Application No. 202011278396.8, filed on Nov. 16, 2020. Both of the aforementioned applications are hereby incorporated by reference in their entireties.

TECHNICAL FIELD

This application belongs to the field of display technologies, and more specifically, relates to a display apparatus and an electronic device.

BACKGROUND

In a display terminal device, power consumption of a display screen accounts for a large proportion of total power consumption of the terminal device. Therefore, to reduce device power consumption, an ambient optical sensor is usually disposed in the terminal device, and brightness of ambient light is detected by using the ambient light sensor. Then, brightness of the display screen is automatically adjusted based on the brightness of the ambient light. In a dark environment, reducing the brightness of the display screen can reduce the power consumption of the display screen, relieve visual fatigue of a user, and improve user experience.

In an existing terminal device, the ambient light sensor is attached to the back of a display panel, and precision of alignment and attachment between the ambient light sensor and the display panel is high. If an attachment position is offset, brightness adjustment of the display panel may be inaccurate. In addition, the ambient light can be received by the ambient light sensor only when the ambient light penetrates a structure layer of the display panel. There is a specific light loss when the ambient light penetrates the display panel. Therefore, a high requirement is imposed on a photosensitive threshold of the ambient light sensor, and costs of the ambient light sensor are increased. In addition, if the ambient optical sensor is attached to the back of the display panel, an overall thickness of the display apparatus is also affected.

SUMMARY

In view of this, this application provides a display apparatus and an electronic device, to detect ambient light information without increasing a thickness of the apparatus and assembly complexity, and to adjust screen brightness based on the ambient light information.

According to a first aspect, an embodiment of this application provides a display apparatus including a display panel. The display panel includes a substrate, a photoelectric detector, and a display surface. The photoelectric detector is located on a side that is of the substrate and that is close to the display surface. The photoelectric detector includes a PN junction or a PIN junction. The photoelectric detector is configured to be reverse biased or zero biased when the display apparatus works in an ambient light detection stage, to generate a photo-generated current under illumination of ambient light and detect ambient light information.

In this embodiment of this application, the photoelectric detector is disposed above the substrate of the display panel to detect the ambient light information, to implement a function of adjusting screen brightness based on an ambient light intensity. The photoelectric detector is located on a side that is of the substrate and that is close to the display surface of the display panel. When the display apparatus is assembled, an ambient light sensor does not need to be additionally attached to the back of the display panel, so that assembly complexity can be reduced, and a module thickness can be reduced. In addition, the photoelectric detector is disposed above the substrate, and ambient light needs to penetrate only a part of a film layer structure of the display panel to be received by the photoelectric detector. Therefore, a light loss of the ambient light is small, and a requirement on a light sensing threshold of the photoelectric detector is reduced, so that costs of implementing an ambient light detection function can be reduced.

In some implementations, the display panel further includes a light emitting device layer located above the substrate, and the light emitting device layer includes a plurality of light emitting devices. When the display apparatus works in a display stage, the plurality of light emitting devices are forward biased for light emitting display. When the display apparatus works in the ambient light detection stage, at least one light emitting device in the plurality of light emitting devices is multiplexed as the photoelectric detector, and the at least one light emitting device is reverse biased or zero biased, to generate the photo-generated current under illumination of the ambient light and detect the ambient light information. Compared with a solution in which an ambient light sensor is attached to the back of a display panel in a related technology, in this application, a light emitting device is multiplexed as the photoelectric detector. In this way, the photoelectric detector is disposed above the substrate, and ambient light needs to penetrate only a part of a film layer structure of the display panel to be received by the photoelectric detector. Therefore, a light loss of the ambient light is small, and a requirement on a light sensing threshold of the photoelectric detector is reduced, so that costs of implementing an ambient light detection function can be reduced. In addition, the ambient light sensor does not need to be additionally attached to the back of the display panel, so that module assembly complexity can be reduced, and a module thickness can be reduced.

Specifically, the display apparatus includes a switching unit and a detection circuit, where the switching unit is configured to implement switching between forward bias and reverse bias or zero bias of the at least one light emitting device, and the detection circuit is configured to detect, in the ambient light detection stage, a photo-generated current generated by the at least one light emitting device. The detection circuit is connected to an anode of the at least one light emitting device through the switching unit, and/or the detection circuit is connected to a cathode of the at least one light emitting device through the switching unit. In this implementation, the switching unit is disposed, so that the light emitting device can be time-division-multiplexed in the display stage and the ambient light detection stage. In the ambient light detection stage, the detection circuit detects a photo current generated by the light emitting device, to detect the ambient light intensity. According to a specific panel design requirement, the detection circuit may be disposed at the anode of the light emitting device, or the detection circuit may be disposed at the cathode of the light emitting device, or the anode and the cathode of the light emitting device are disposed to be connected to the detection circuit through the switching unit.

In an embodiment, the switching unit includes a first switching unit and a second switching unit; and the anode of the at least one light emitting device is connected to the detection circuit and a light emitting anode power end through the first switching unit, and the cathode of the at least one light emitting device is connected to a light emitting cathode power end and a first detection voltage end through the second switching unit. When the display apparatus works in the display stage, the first switching unit controls the anode of the at least one light emitting device to connect to the light emitting anode power end, the second switching unit controls the cathode of the at least one light emitting device to connect to the light emitting cathode power end, and the at least one light emitting device is forward biased. When the display apparatus works in the ambient light detection stage, the first switching unit controls the anode of the at least one light emitting device to connect to the detection circuit, the second switching unit controls the cathode of the at least one light emitting device to connect to the first detection voltage end, and the at least one light emitting device is reverse biased or zero biased. In this implementation, the detection circuit is disposed at the anode of the light emitting device, and the detection circuit is configured to detect, in the ambient light detection stage, the photo-generated current generated vhen the light emitting device is illuminated.

In another embodiment, the switching unit includes a first switching unit and a second switching unit, and the anode of the at least one light emitting device is connected to a light emitting anode power end and a second detection voltage end through the first switching unit, and the cathode of the at least one light emitting device is connected to a light emitting cathode power end and the detection circuit through the second switching unit. When the display apparatus works in the display stage, the first switching unit controls the anode of the at least one light emitting device to connect to the light emitting anode power end, the second switching unit controls the cathode of the at least one light emitting device to connect to the light emitting cathode power end, and the at least one light emitting device is forward biased. When the display apparatus works in the ambient light detection stage, the first switching unit controls the anode of the at least one light emitting device to connect to the second detection voltage end, the second switching unit controls the cathode of the at least one light emitting device to connect to the detection circuit, and the at least one light emitting device is reverse biased or zero biased. In this implementation, the detection circuit is disposed at the cathode of the light emitting device, and the detection circuit is configured to detect, in the ambient light detection stage, the photo-generated current generated when the light emitting device is illuminated.

In another embodiment, the switching unit includes a first switching unit and a second switching unit, and the detection circuit is a differential detection circuit; and the anode of the at least one light emitting device is connected to the differential detection circuit and a light emitting anode power end through the first switching unit, and the cathode of the at least one light emitting device is connected to a light emitting cathode power end and the differential detection circuit through the second switching unit. When the display apparatus works in the display stage, the first switching unit controls the anode of the at least one light emitting device to connect to the light emitting anode power end, the second switching unit controls the cathode of the at least one light emitting device to connect to the light emitting cathode power end, and the at least one light emitting device is forward biased. When the display apparatus works in the ambient light detection stage, the first switching unit controls the anode of the at least one light emitting device to connect to the differential detection circuit, the second switching unit controls the cathode of the at least one light emitting device to connect to the differential detection circuit, and the at least one light emitting device is reverse biased or zero biased.

In another embodiment, the switching unit includes a first switching unit; and the anode of the at least one light emitting device is connected to a light emitting anode power end and a second detection voltage end through the first switching unit, and the cathode of the at least one light emitting device is connected to a light emitting cathode power end. When the display apparatus works in the display stage, the first switching unit controls the anode of the at least one light emitting device to connect to the light emitting anode power end, and the at least one light emitting device is forward biased. When the display apparatus works in the ambient light detection stage, the first switching unit controls the anode of the at least one light emitting device to connect to the second detection voltage end, and controls a voltage value provided by the second detection voltage end to be less than or equal to a voltage value provided by the light emitting cathode power end, and the at least one light emitting device is reverse biased or zero biased. In this implementation, only the first switching unit is disposed, to implement switching between a connection between the anode of the light emitting device and the light emitting anode power end and a connection between the anode of the light emitting device and the second detection voltage end, and no switching unit needs to be disposed at the cathode of the light emitting device for ambient light detection, so that a quantity of disposed switching units can be reduced. In practice, a cathode layer is usually an entire layer, and may provide different voltage signals to the light emitting cathode power end at different stages through a same output port of a drive chip. In this manner, a connection manner between the light emitting cathode power end and the drive chip does not need to be changed, and a structure is simple.

Specifically, the display panel further includes an array layer located between the substrate and the light emitting device layer, and both the detection circuit and the switching unit are located at the array layer. The display apparatus further includes a drive chip, and a control end of the detection circuit and a control end of the switching unit are electrically connected to the drive chip separately. The drive chip is configured to provide a control signal for the control end of the switching unit, so that the at least one light emitting device switches between forward bias and reverse bias or zero bias. The ambient light information includes ambient light intensity information. The drive chip is further configured to: receive the photo-generated current detected by the detection circuit, process the photo-generated current to obtain the ambient light intensity information, and control display brightness of the display apparatus based on the ambient light intensity information.

In another embodiment, the display panel further includes a light emitting device layer located above the substrate, and the light emitting device layer includes a plurality of light emitting devices, the plurality of light emitting devices include a first light emitting device and a second light emitting device, and the first light emitting device is the photoelectric detector. When the display apparatus works in an ambient light detection stage, the first light emitting device is reverse biased or zero biased, to generate a photo-generated current under illumination of ambient light and detect ambient light information. When the display apparatus works in a display stage, the second light emitting device is forward biased for light emitting display. In this implementation, some light emitting devices in the light emitting device array are used as photoelectric detectors, and the some light emitting devices are only used for ambient light detection, and are not used for light emitting display. Although a display function of the some light emitting devices is sacrificed, the photoelectric detector is disposed above the substrate, and ambient light needs to penetrate only a part of a film layer structure of the display panel to be received by the photoelectric detector. Therefore, a light loss of the ambient light is small, and a requirement on a light sensing threshold of the photoelectric detector is reduced, so that costs of implementing an ambient light detection function can be reduced.

In another embodiment, the display panel further includes a light emitting device layer located above the substrate, and the light emitting device layer includes a plurality of light emitting devices; and the photoelectric detector is located between two adjacent light emitting devices. Optionally, the photoelectric detector and the light emitting device are located at a same layer. When the display panel is manufactured, the photoelectric detector and the light emitting device are manufactured in a same process. In this way, the photoelectric detector is disposed above the substrate, and ambient light needs to penetrate only a part of a film layer structure of the display panel to be received by the photoelectric detector. Therefore, a light loss of the ambient light is small, and a requirement on a light sensing threshold of the photoelectric detector is reduced, so that costs of implementing an ambient light detection function can be reduced.

In another embodiment, the display panel further includes a light emitting device layer located above the substrate, and the light emitting device layer includes a plurality of light emitting devices; and the photoelectric detector is located on a side that is of the light emitting device layer and that is away from the substrate. Specifically, the photoelectric detector includes a photoelectric detection layer. The photoelectric detection layer may be an entire layer; or the photoelectric detection layer is provided with a plurality of openings, and one opening corresponds to one light emitting device. During display, light emitted by the light emitting device penetrates the photoelectric detection layer through the opening, to reduce a light loss and improve display brightness.

Further, the display apparatus further includes a detection circuit, where the detection circuit is configured to detect, in the ambient light detection stage, a photo-generated current generated by the photoelectric detector; and the detection circuit is connected to an anode of the photoelectric detector, and/or is connected to a cathode of the photoelectric detector.

Further, the display apparatus further includes a processing module and a brightness control module. The detection circuit is configured to: convert the photo-generated current generated by the photoelectric detector into an electrical signal, and send the electrical signal to the processing module for processing. The processing module is configured to: process the received electrical signal to obtain the ambient light information, and send a processing result to the brightness control module, where an ambient light signal includes ambient light intensity information. The brightness control module is configured to control display brightness of the display apparatus based on the processing result. In this implementation, the photoelectric detector can detect the ambient light intensity information, to adjust brightness of the display apparatus based on the ambient light intensity.

According to a second aspect, an embodiment of this application further provides an electronic device, including the display apparatus provided in any embodiment of this application.

The display apparatus and the electronic device provided in this application have the following beneficial effects. The photoelectric detector is disposed above the substrate to detect the ambient light information, to implement a function of adjusting screen brightness based on an ambient light intensity. When the display apparatus is assembled, an ambient light sensor does not need to be additionally attached to the back of the display panel, so that assembly complexity can be reduced, and a module thickness can be reduced. In addition, the photoelectric detector is manufactured above the substrate, and ambient light needs to penetrate only a part of a film layer structure of the display panel to be received by the photoelectric detector. Therefore, a light loss of the ambient light is small, and a requirement on a light sensing threshold of the photoelectric detector is reduced, so that costs of implementing an ambient light detection function can be reduced.

DESCRIPTION OF EMBODIMENTS

Figure 1:
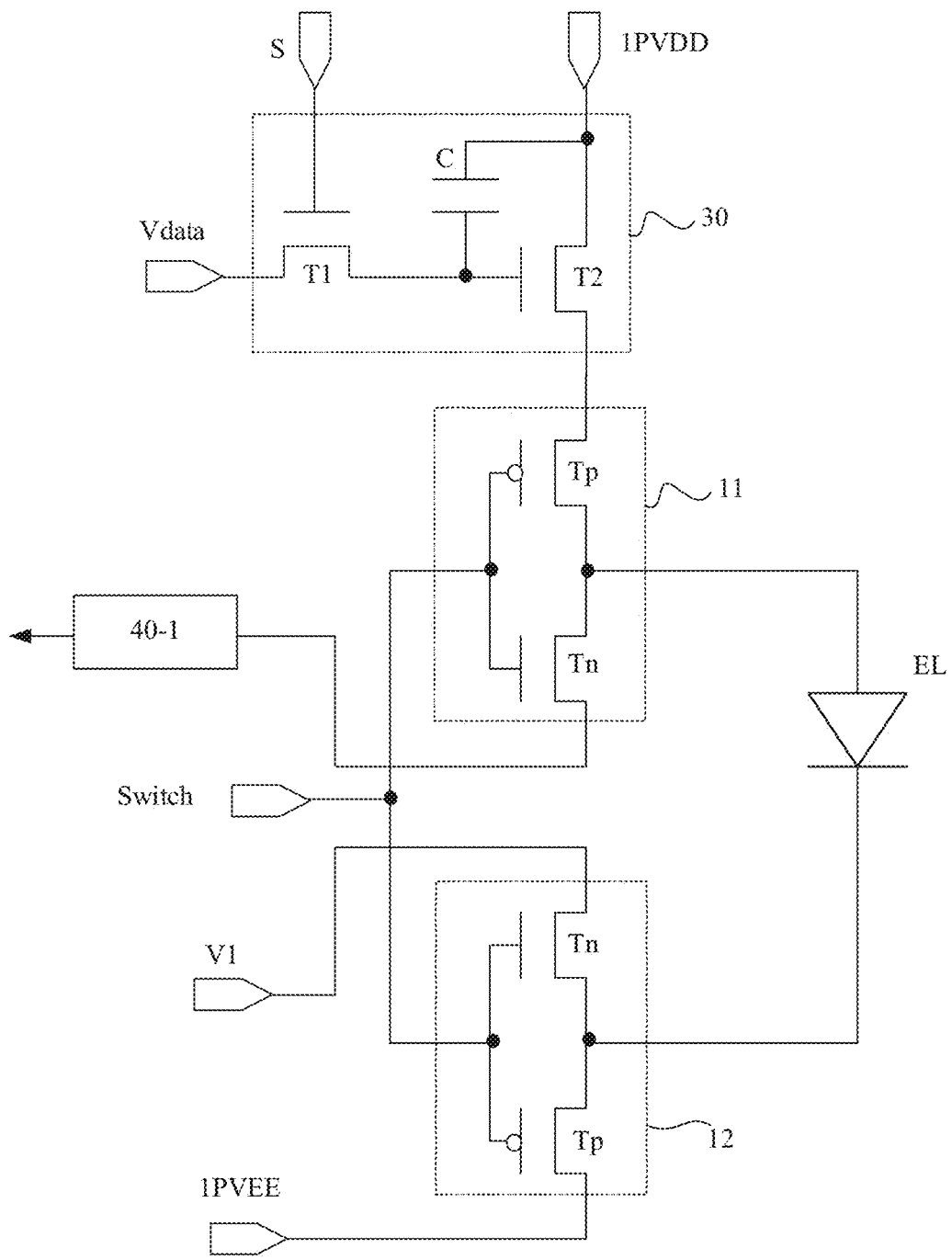
FIG. 1 is a diagram of a circuit structure of an optional implementation of a display apparatus according to an embodiment of this application.

An embodiment of this application provides a display apparatus and an electronic device. The display apparatus includes a display panel. A photoelectric detector is disposed above a substrate of the display panel to detect ambient light information, to implement a function of adjusting screen brightness based on an ambient light intensity. The photoelectric detector is located on a side that is of the substrate and that is close to the display surface of the display panel. The display surface is understood as a surface on which the display panel displays an image picture. When the display apparatus is assembled, an ambient light sensor does not need to be additionally attached to the back of the display panel, so that assembly complexity can be reduced, and a module thickness can be reduced. In addition, the photoelectric detector is disposed above the substrate, and ambient light needs to penetrate only a part of a film layer structure of the display panel to be received by the photoelectric detector. Therefore, a light loss of the ambient light is small, and a requirement on a light sensing threshold of the photoelectric detector is reduced, so that costs of implementing an ambient light detection function can be reduced.

The display apparatus provided in this embodiment of this application is an organic light emitting display apparatus or a micro LED (Light-Emitting Diode) display apparatus. In an implementation, the photoelectric detector may be a light emitting device in the display apparatus. To be specific, the light emitting device is used for light emitting display in a display stage, and the light emitting device is multiplexed as the photoelectric detector in an ambient light detection stage to detect ambient light. In another implementation, a structure of the photoelectric detector may be the same as that of the light emitting device in the display apparatus, but the photoelectric detector is only configured to detect ambient light in the ambient light detection stage. In another embodiment, a photoelectric detector may be added to the film layer structure of the display panel. For example, the photoelectric detector is manufactured between two adjacent light emitting devices, or the photoelectric detector is manufactured in a film layer structure on a side that is of the light emitting device and that is away from the substrate, or the photoelectric detector is manufactured at an edge of the substrate. The following describes a setting manner and a working manner of the photoelectric detector in this application by using specific embodiments.

In this embodiment of this application, the photoelectric detector is of a PN junction structure or a PIN junction structure, and includes a P-type semiconductor layer and an N-type semiconductor layer. An electrode led out from the P-type semiconductor layer is an anode, and an electrode led out from the N-type semiconductor layer is a cathode. Based on a structural feature of the photoelectric detector, the photoelectric detector can have an electrical-to-optical conversion capability when the photoelectric detector is forward biased, and has an optical-to-electrical conversion capability when the photoelectric detector is reverse biased or zero biased. In this application, ambient light detection is mainly performed by using a photoelectric detector that has an optical-to-electrical conversion capability in a reverse bias or zero bias state. When the photoelectric detector receives ambient light illumination in the reverse bias or zero bias state, a reverse current, which may also be referred to as a photo-generated current, is generated. A magnitude of the photo-generated current can reflect an ambient light intensity, so that an electrical signal generated when the photoelectric detector receives the ambient light is used for detecting the ambient light intensity.

In an embodiment, the display panel in the display apparatus includes a substrate, an array layer, and a light emitting device layer that are stacked in sequence. The light emitting device layer includes a plurality of light emitting devices, where the light emitting device is configured to emit light to display an image. A light emitting direction of the display apparatus is a direction from the substrate to the light emitting device. The light emitting device in the display panel is used as the photoelectric detector, and is used for light emitting display in the display stage, and the light emitting device is multiplexed as the photoelectric detector in the ambient light detection stage. The light emitting device may be an organic light emitting diode or an inorganic light emitting diode. The light emitting diode is driven by a current. Therefore, a pixel circuit is further disposed in the display panel to drive the light emitting device to emit light. In this implementation, the light emitting device that can be multiplexed as the photoelectric detector is a multiplexed light emitting device. When the display apparatus works in a display stage, the light emitting device is forward biased for light emitting display. When the display apparatus works in the ambient light detection stage, the light emitting device is multiplexed as the photoelectric detector, and the light emitting device is reverse biased or zero biased, to generate the photo-generated current under illumination of the ambient light and detect the ambient light information.

Figure 2:
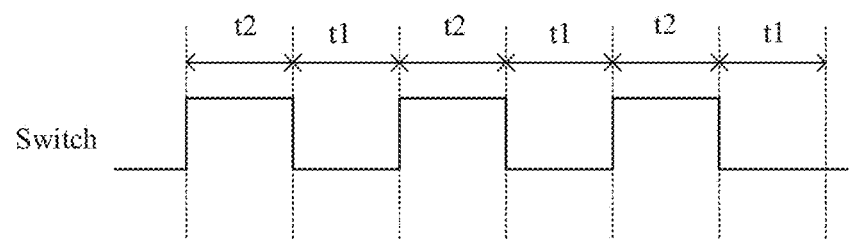
FIG. 2 is a diagram of a control time sequence of a switching unit according to an embodiment of this application.

Specifically, FIG. 1 is a diagram of a circuit structure of an optional implementation of a display apparatus according to an embodiment of this application. FIG. 2 is a diagram of a control time sequence of a switching unit according to an embodiment of this application. The display apparatus includes a switching unit. The switching unit is configured to implement switching between a forward bias state and a reverse bias state (or a zero bias state) of the multiplexed light emitting device EL.

As shown in FIG. 1, the switching unit includes a first switching unit 11 and a second switching unit 12. An anode of the light emitting device EL is electrically connected to the first switching unit 11, and a cathode of the light emitting device EL is electrically connected to the second switching unit 12. The first switching unit 11 is configured to switch a connection state of the anode of the light emitting device EL. In a display stage, the first switching unit 11 controls the anode of the light emitting device EL to electrically connect to a light emitting positive power end 1PVDD. In an ambient light detection stage, the first switching unit 11 controls the anode of the light emitting device EL to electrically connect to a detection circuit 40-1. The second switching unit 12 is configured to switch a connection state of the cathode of the light emitting device EL. In the display stage, the second switching unit 12 controls the cathode of the light emitting device EL to electrically connect to a light emitting negative power end 1PVEE. In the ambient light detection stage, the second switching unit 12 controls the cathode of the light emitting device EL to electrically connect to a first detection voltage end V1.

A control end of the first switching unit 11 and a control end of the second switching unit 12 are both electrically connected to a control signal end Switch. The light emitting positive power end 1PVDD cooperates with the light emitting negative power end 1PVEE, and controls a voltage signal of the anode of the light emitting device EL to be greater than a voltage signal of the cathode of the light emitting device EL, to control the light emitting device EL to be forward biased. The first detection voltage end V1 cooperates with the detection circuit 40-1, to control a voltage signal of the cathode of the light emitting device EL to be greater than or equal to the voltage signal of the anode of the light emitting device EL, and to control the light emitting device EL to be backward biased or zero biased.

The display apparatus includes a pixel circuit 30, where the pixel circuit 30 is configured to drive the light emitting device to emit light, and the anode of the light emitting device EL is electrically connected to the pixel circuit 30 and the detection circuit 40-1 through the first switching unit 11. When the anode of the light emitting device EL is electrically connected to the pixel circuit 30, the anode of the light emitting device EL is electrically connected to the light emitting positive power end 1PVDD through the pixel circuit 30. The cathode of the light emitting device EL is electrically connected to the light emitting negative power end 1PVEE and the first detection voltage end V1 through the second switching unit 12.

In a display stage t1, the control signal end Switch provides a first control signal. As shown in FIG. 2, the first control signal is a low-level signal. The first switching unit 11 controls, under control of the first control signal, an output end of the pixel circuit 30 to connect to the anode of the light emitting device EL; and the second switching unit 12 controls, under control of the first control signal, the light emitting negative power end 1PVEE to connect to the cathode of the light emitting device EL. In the display stage t1, the light emitting device EL is forward biased, and the light emitting device EL can be used for emitting light.

In an ambient light detection stage t2, the control signal end Switch provides a second control signal. As shown in FIG. 2, the second control signal is a high-level signal. The first switching unit 11 controls, under control of the second control signal, the detection circuit 40-1 to connect to the anode of the light emitting device EL; and the second switching unit 12 controls, under control of the second control signal, the first detection voltage end V1 to connect to the cathode of the light emitting device EL. A detection loop is formed in the ambient light detection stage t2. A voltage of an input end (namely, an end connected to the anode of the light emitting device) of the detection circuit 40-1 is controlled to be less than or equal to a voltage of the first detection voltage end V1. The light emitting device EL is reverse biased or zero biased, and the light emitting device EL can be used for ambient light detection.

In the ambient light detection stage t2, when illuminated by ambient light, the reverse biased or zero biased light emitting device EL generates a photo-generated current. In this case, the detection circuit 40-1 is connected to the anode of the light emitting device EL through the first switching unit 11, and the detection circuit 40-1 can be configured to detect the photo-generated current to generate an electrical signal.

Figure 3:
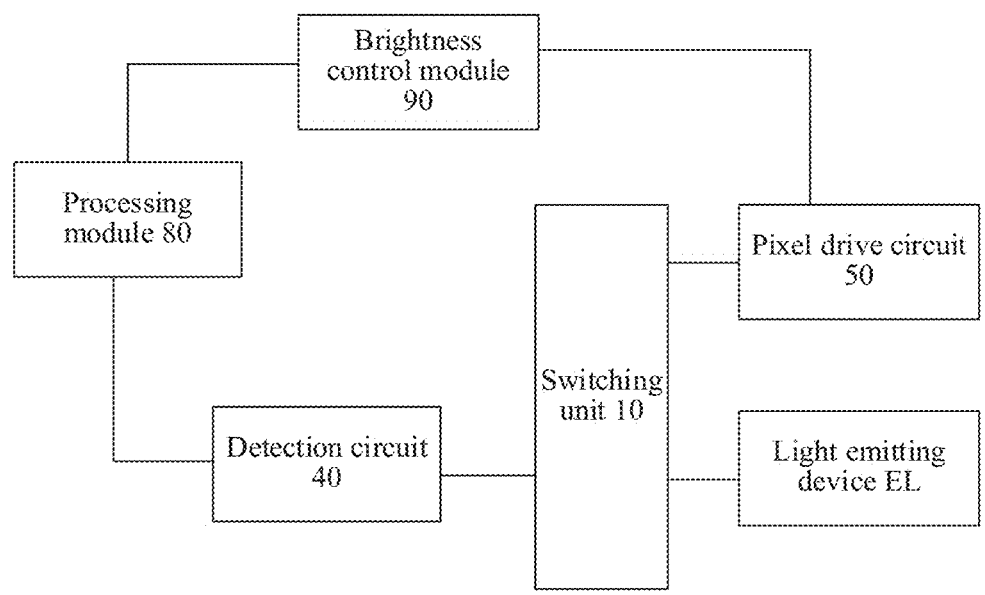
FIG. 3 is a diagram of a module structure of a display apparatus according to an embodiment of this application.

FIG. 3 is a diagram of a module structure of a display apparatus according to an embodiment of this application. As shown in FIG. 3, a detection circuit 40 and a pixel drive circuit 50 are connected to a light emitting device EL through a switching unit 10. The detection circuit 40 is configured to implement photo-generated current detection. The switching unit 10 controls the light emitting device EL to be connected to the pixel drive circuit 50, or controls the light emitting device EL to be electrically connected to the detection circuit 40. In an ambient light detection stage, the detection circuit 40 is electrically connected to the light emitting device EL, the detection circuit 40 sends a detected electrical signal to a processing module 80 for processing, and the processing module 80 can perform quantization processing on a voltage signal. A higher ambient light intensity indicates a larger photo-generated current generated by the light emitting device EL and a larger quantity of electrical signals detected by the detection circuit 40. A lower ambient light intensity indicates a smaller photo-generated current generated by the light emitting device EL and a smaller quantity of electrical signals detected by the detection circuit 40. The processing module 80 is connected to a brightness control module 90. In the display stage, the brightness control module 90 controls brightness of a display screen based on a processing result of the processing module 80, to adjust display brightness based on the ambient light intensity.

Specifically, a brightness adjustment mapping table (as shown in Table 1) may be stored in the processing module 80. During ambient light adjustment, an intensity level of ambient light may be determined based on a detected magnitude of a photo current generated by the light emitting device EL, and the following table may be searched for a corresponding screen brightness level and a magnitude of a display drive current of the corresponding light emitting device EL. Then, the brightness control module controls the light emitting device EL to display at the found display drive current, to adjust display brightness based on the ambient light intensity.

TABLE 1

Brightness adjustment mapping table

| Ambient light intensity | Screen brightness level | EL display drive current magnitude |
|---|---|---|
| 1 | 1 | X1 |
| 2 | 2 | X2 |
| 3 | 3 | X3 |
| . . . | . . . | . . . |

Figure 4:
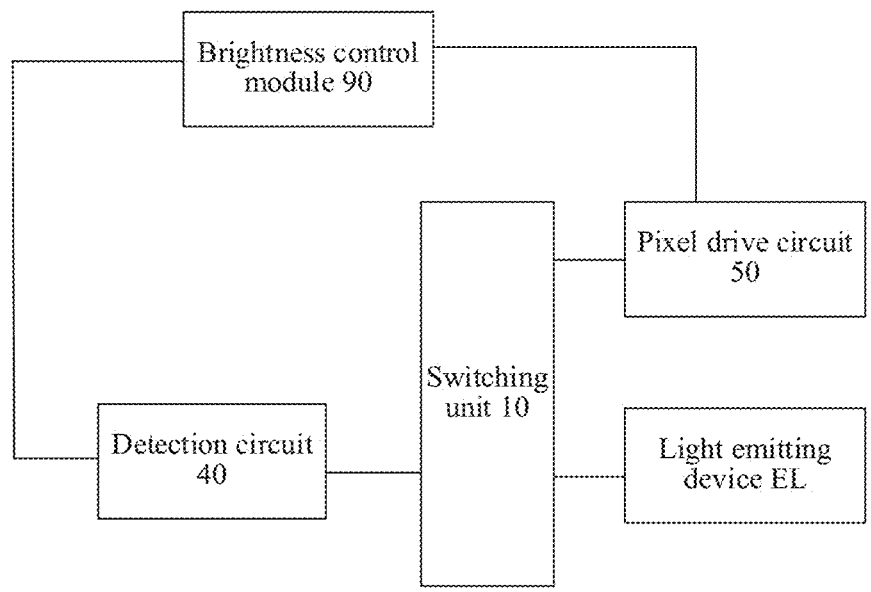
FIG. 4 is a diagram of another module structure of a display apparatus according to an embodiment of this application.

In another implementation, a detection electrical signal is directly output by using a detection circuit for ambient light detection, to control a display drive current of a light emitting device EL based on feedback. As shown in FIG. 4, FIG. 4 is a diagram of a structure of another module of a display apparatus according to an embodiment of this application. A detection circuit 40 and a pixel drive circuit 50 are connected to a light emitting device EL through a switching unit 10. The detection circuit 40 is electrically connected to a brightness control module 90. When the detection circuit 40 detects that a photo current generated by the light emitting device EL increases, the brightness control module 90 adjusts a display drive current of the light emitting device EL to increase; otherwise, when the detection circuit 40 detects that the photo-generated current generated by the light emitting device EL decreases, the brightness control module 90 adjusts the display drive current of the light emitting device EL to decrease. An advantage of this implementation is that brightness adjustment of a display screen can be quickly implemented, to improve user experience. Optionally, the brightness control module may be integrated into a pixel control circuit.

The display apparatus provided in this embodiment of this application further includes a drive chip. The drive chip is electrically connected to a display panel. The display panel includes a substrate, an array layer located above the substrate, and a light emitting device located on the array layer. The display panel includes a pixel circuit, the pixel circuit is electrically connected to the light emitting device, and the drive chip is configured to provide a signal to the pixel circuit to drive the light emitting device to perform light emitting display.

In an embodiment, both the detection circuit and the switching unit are located at the array layer. Control ends of the detection circuit and the switching unit are electrically connected to the drive chip. The drive chip is configured to provide a control signal for the control end of the switching unit, so that the light emitting device switches between forward bias and reverse bias or zero bias. In other words, the drive chip provides a control signal for a control signal end Switch, to control the light emitting device to switch between forward bias and reverse bias or zero bias. The drive chip is further configured to: receive the photo-generated current detected by the detection circuit, process the photo-generated current to obtain ambient light intensity information, and control display brightness of the display apparatus based on the ambient light intensity information.

Further, the drive chip includes a processing module and a brightness control module. The processing module is configured to: process a received electrical signal to obtain ambient light information, and send a processing result to the brightness control module, where an ambient light signal includes ambient light intensity information. The brightness control module is configured to control display brightness of the display apparatus based on the processing result.

In another embodiment, the detection circuit, the processing module, and the brightness control module are all located at the array layer of the display panel, the switching unit is electrically connected to the drive chip, and the drive chip provides a control signal to the control signal end Switch, to control the multiplexed light emitting device to switch between forward bias and reverse bias or zero bias. Optionally, a detection voltage end (including the first detection voltage end V1 in the embodiment in FIG. 1 and a second detection voltage end V2 that may appear in the following embodiment) is electrically connected to the drive chip, and the drive chip provides a voltage signal for the detection voltage end. Correspondingly, in the embodiment in FIG. 1, in an ambient light detection stage, the drive chip is further configured to provide the voltage signal for the first detection voltage end V1, so that the light emitting device EL is reverse biased or zero biased.

In another embodiment, the detection circuit is located at the array layer of the display panel, the processing module and the brightness control module are integrated into an application processor chip, the switching unit is connected to the application processor chip, and the application processor chip provides a control signal to a control signal end Switch, to control the display apparatus to switch between a display stage and an ambient light detection stage. Optionally, a detection voltage end (including the first detection voltage end V1 in the embodiment in FIG. 1 and a second detection voltage end V2 that may appear in the following embodiment) is electrically connected to the application processor chip, and the application processor chip provides a voltage signal for the detection voltage end. Correspondingly, in the embodiment in FIG. 1, in the ambient light detection stage, the application processor chip may provide the voltage signal for the first detection voltage end V1. The detection circuit and the switching unit are disposed in the display apparatus, and the switching unit controls the light emitting device to switch between a forward bias state and a reverse bias state (or a zero bias state), so that the light emitting device can be multiplexed as a photoelectric detector in a time division manner, to implement a function of adjusting display brightness based on the ambient light intensity. In an application, switching between the ambient light detection stage and the display stage may be performed during display of a frame, to implement ambient light intensity detection. Alternatively, ambient light detection may be performed between display of two adjacent frames. To be specific, after a frame is displayed, the switching unit controls the light emitting device to be reverse biased or zero biased.

Compared with a solution in which an ambient light sensor is attached to the back of a display panel in a related technology, in this application, a light emitting device is multiplexed as the photoelectric detector, that is, the photoelectric detector is disposed above the substrate. In this way, ambient light needs to penetrate only a part of a film layer structure of the display panel to be received by the photoelectric detector. Therefore, a light loss of the ambient light is small, and a requirement on a light sensing threshold of the photoelectric detector is reduced, so that costs of implementing an ambient light detection function can be reduced. In addition, the ambient light sensor does not need to be additionally attached to the back of the display panel provided in this embodiment, so that module assembly complexity can be reduced, and a module thickness can be reduced.

Specifically, the switching unit includes an n-type transistor Tn and a p-type transistor Tp.

In an embodiment, as shown in FIG. 1, in a first switching unit 11, a control end of the n-type transistor Tn and a control end of the p-type transistor Tp are both electrically connected to a control signal end Switch, a first end of the n-type transistor Tn is electrically connected to an anode of a light emitting device EL, and a second end of the n-type transistor Tn is electrically connected to a detection circuit 40-1. A first end of the p-type transistor Tp is electrically connected to an output end of a pixel circuit 30, and a second end of the p-type transistor Tp is electrically connected to the anode of the light emitting device EL. In a second switching unit 12, a control end of the n-type transistor Tn and a control end of the p-type transistor Tp are both electrically connected to a control signal end Switch, a first end of the n-type transistor Tn is electrically connected to a first detection voltage end V1, and a second end of the n-type transistor Tn is electrically connected to a cathode of the light emitting device EL. A first end of the p-type transistor Tp is electrically connected to a light emitting negative power end 1PVEE, and a second end of the p-type transistor Tp is electrically connected to the cathode of the light emitting device EL. It should be noted that, in a structure of a transistor, a control end of the transistor is a gate of the transistor, and when a first end of the transistor is a source, a second end of the transistor is a drain; or when a first end of the transistor is a drain, a second end of the transistor is a source.

For understanding, refer to the diagram of the time sequence shown in FIG. 2. In a display stage t1, the control signal end Switch provides a low-level signal. In the first switching unit 11, the p-type transistor Tp is turned on, and the n-type transistor Tn is turned off. In this case, the first switching unit 11 controls the output end of the pixel circuit 30 to be electrically connected to the anode of the light emitting device EL. In the second switching unit 12, the p-type transistor Tp is turned on, and the n-type transistor Tn is turned off. In this case, the second switching unit 12 controls the light emitting negative power end 1PVEE to be electrically connected to the cathode of the light emitting device EL. In the display stage t1, the light emitting device EL is forward biased, and may be used for light emitting display.

In an ambient light detection stage t2, the control signal end Switch provides a high-level signal. In the first switching unit 11, the n-type transistor Tn is turned on, and the p-type transistor Tp is turned off. In this case, the first switching unit 11 controls the detection circuit 40-1 to be electrically connected to the anode of the light emitting device EL. In the second switching unit 12, the n-type transistor Tn is turned on, and the p-type transistor Tp is turned off. In this case, the second switching unit 12 controls the first detection voltage end V1 to be electrically connected to the cathode of the light emitting device EL. In the ambient light detection stage t2, the first detection voltage end V1 cooperates with the detection circuit 40-1, and the light emitting device EL may be reverse biased or zero biased, to detect the ambient light intensity.

It should be noted that, the structures of the first switching unit and the second switching unit are merely examples. In another embodiment, in the first switching unit, the n-type transistor is electrically connected to the pixel circuit, and the p-type transistor is electrically connected to the detection circuit; in the second switching unit, the n-type transistor is electrically connected to the light emitting negative power end, and the p-type transistor is electrically connected to the first detection voltage end. When the control signal end Switch provides the high-level signal, the light emitting device EL can be controlled to be forward biased; and when the control signal end Switch provides the low-level signal, the light emitting device EL can be controlled to be reverse biased or zero biased. In this way, the light emitting device can switch between light emitting display and ambient light detection. Details are not described herein with reference to the drawings.

In this embodiment of this application, in the ambient light detection stage, the detection circuit is configured to detect a photo-generated current generated when the light emitting device is illuminated by ambient light in a reverse bias state or a zero bias state. In other words, the detection circuit is configured to detect a magnitude of the photo-generated current. There may be a plurality of implementations for a circuit structure that can detect the magnitude of the current. A specific circuit structure of the detection circuit is not limited in this application. The following describes a structure of the detection circuit by using only an optional detection manner of the photo-generated current as an example.

Figure 5:
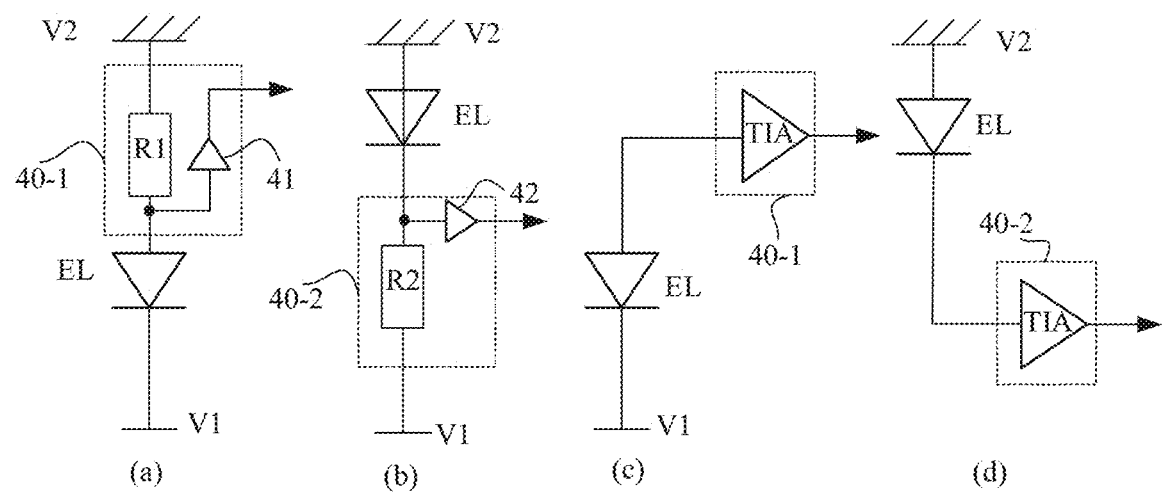
FIG. 5 is a principle diagram of a photo-generated current detection manner.

FIG. 5 is a principle diagram of a photo-generated current detection manner. The figure shows a first detection voltage end V1 and a second detection voltage end V2. In a same circuit loop, a voltage value of a signal provided by the first detection voltage end V1 is greater than or equal to a voltage value of a signal provided by the second detection voltage end V2, so that a light emitting device is reverse biased or zero biased in an ambient light detection stage. In an embodiment, as shown in (a) in FIG. 5, a detection circuit 40-1 is electrically connected to an anode of a light emitting device EL, the detection circuit 40-1 includes a resistor R1, and optionally, the detection circuit 40-1 further includes a voltage amplifier 41. The detection circuit 40-1 converts a photo-generated current generated by the light emitting device EL into a voltage signal, and then provides the voltage signal for a processing module for processing. The resistor R1 in the detection circuit 40-1 may also be replaced with a capacitor. As shown in (b) in FIG. 5, a detection circuit 40-2 is electrically connected to a cathode of a light emitting device EL, the detection circuit 40-2 includes a resistor R2, and optionally, the detection circuit 40-2 further includes a voltage amplifier 42. The detection circuit 40-2 converts a photo-generated current generated by the light emitting device EL into a voltage signal, and then provides the voltage signal for a processing module for processing. In another embodiment, as shown in (c) in FIG. 5, a detection circuit 40-1 includes a trans-impedance amplifier (Trans-Impedance Amplifier, TIA). The trans-impedance amplifier TIA is electrically connected to an anode of a light emitting device EL. The trans-impedance amplifier TIA converts a photo-generated current generated by the light emitting device EL into a voltage signal, and then provides the voltage signal for the processing module for processing. As shown in (d) in FIG. 5, a trans-impedance amplifier TIA in a detection circuit 40-2 is electrically connected to a cathode of a light emitting device EL, that is, a photo-generated current is detected at the cathode.

In another embodiment, a detection circuit includes a mirror current source, a mirror current is obtained by mirroring a photo-generated current generated by a light emitting device EL, and then the mirror current is converted into a voltage signal in the manner shown in (a) or (c) in FIG. 5 for subsequent processing.

In addition, FIG. 1 further shows a pixel circuit 30. The pixel circuit 30 includes a switch transistor T1, a drive transistor T2, and a capacitor C. A control end of the switch transistor T1 is electrically connected to a scanning signal end S, a first end of the switch transistor T1 is electrically connected to a data signal end Vdata, and a second end of the switch transistor T2 is electrically connected to a control end of the drive transistor T2. A first end of the drive transistor T2 is electrically connected to a light emitting positive power end 1PVDD, and a second end of the drive transistor T2 is electrically connected to an output end of the pixel circuit 30. In the embodiment in FIG. 1, the output end of the pixel circuit 30 is electrically connected to a first switching unit 10. A first plate of the capacitor C is electrically connected to the light emitting positive power end 1PVDD, and a second plate of the capacitor C is electrically connected to the control end of the drive transistor T2. A specific structure of the pixel circuit and a type of the transistor in the pixel circuit are not limited in this embodiment of this application. The embodiment in FIG. 1 is applicable to any pixel circuit in a current technology.

Figure 6:
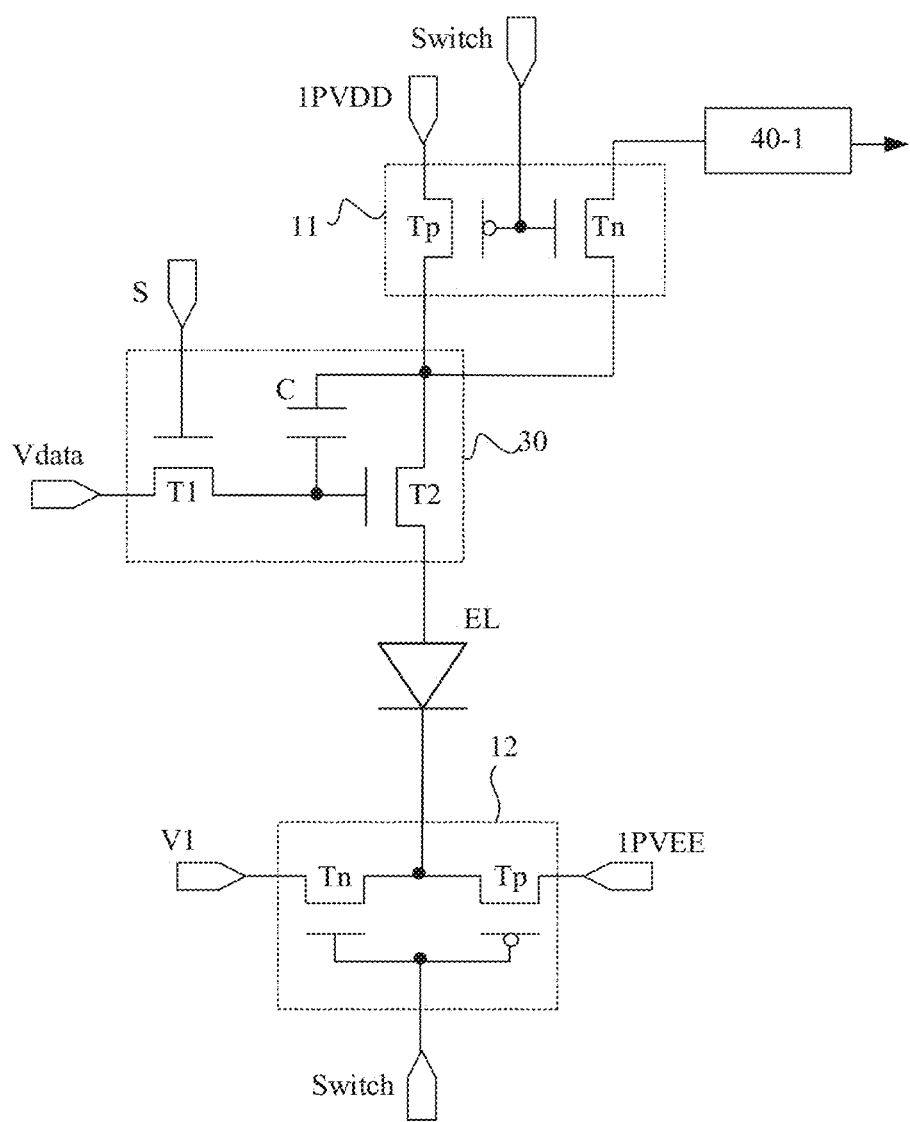
FIG. 6 is a diagram of a circuit structure of another optional implementation of a display apparatus according to an embodiment of this application.

In the embodiment in FIG. 1, a switching unit is disposed between the pixel circuit and the anode of the light emitting device, to switch an anode input voltage signal in the display stage and the ambient light detection stage. The pixel circuit is only configured to drive the light emitting device to emit light in the display stage. In the ambient light detection stage, the pixel circuit is disconnected from the anode of the light emitting device, the pixel circuit does not participate in ambient light detection, and a working time sequence of the pixel drive circuit does not need to be changed. In another embodiment, the pixel circuit may also be designed to participate in ambient light detection. FIG. 6 is a diagram of a circuit structure of another optional implementation of a display apparatus according to an embodiment of this application. As shown in FIG. 6, a pixel circuit 30 is still shown by using a circuit structure of 2T1C, and a switching unit further includes a first switching unit 11. The first switching unit 11 is configured to switch a connection state of an anode of a light emitting device EL. The light emitting positive power end 1PVDD is electrically connected to the pixel unit 30 (at a first end of a drive transistor T2) through the first switching unit 11, and a detection circuit 40-1 is electrically connected to the pixel circuit 30 through the first switching unit 11 (that is, electrically connected to the first end of the drive transistor T2 as shown in the figure). A control end of the first switching unit 11 is electrically connected to a control signal end Switch. The detection circuit 40-1 is electrically connected to an anode of the light emitting device through the first switching unit 11 and the pixel circuit 30. That is, the detection circuit 40-1 is disposed at an anode of the light emitting device.

Specifically, the first switching unit 11 includes an n-type transistor Tn and a p-type transistor Tp. In the first switching unit 11, a control end of the n-type transistor Tn and a control end of the p-type transistor Tp are both electrically connected to the control signal end Switch, a first end of the n-type transistor Tn is electrically connected to the detection circuit 40-1, and a second end of the n-type transistor Tn is electrically connected to the first end of the drive transistor T2. A first end of the p-type transistor Tp is electrically connected to the light emitting positive power end 1PVDD, and a second end of the p-type transistor Tp is electrically connected to the first end of the drive transistor T2. A connection manner of a second switching unit 12 is the same as that in the embodiment in FIG. 1, and details are not described herein again.

Refer to the diagram of the time sequence shown in FIG. 2. In a display stage t1, the control signal end Switch provides a low-level signal, and the p-type transistor Tp in the switching unit is turned on. The light emitting positive power end 1PVDD is electrically connected to the first end of the drive transistor T2 of the pixel circuit 30, and the pixel circuit 30 can provide a voltage signal for the anode of the light emitting device EL. The cathode of the light emitting device EL is electrically connected to the light emitting negative power end 1PVEE. Therefore, in the display stage t1, the light emitting device EL can be forward biased and used for light emitting display.

In an ambient light detection stage t2, the control signal end Switch provides a high-level signal, and the n-type transistor Tn in the switching unit is turned on. The detection circuit 40-1 is electrically connected to the first end of the drive transistor T2, which is equivalent to that the detection circuit 40-1 is electrically connected to the anode of the light emitting device EL through the pixel circuit 30. The cathode of the light emitting device EL is electrically connected to the first detection voltage end V1. In this stage, a voltage at the anode of the light emitting device EL is controlled to be less than or equal to a voltage provided by the first detection voltage end V1, so that the light emitting device EL is reverse biased or zero biased. A signal of a data signal end Vdata, a signal of a scanning signal end S, and a signal of the control signal end Switch cooperate with each other, so that the driving transistor T2 can be turned on. In this way, a reverse current generated by the light emitting device EL under illumination of ambient light can be transferred to the n-type transistor Tn through the drive transistor T2, and then is detected by the detection circuit 40-1, to detect ambient light intensity.

In this implementation, the photo-generated current generated by the light emitting device can be detected only when the pixel circuit participates in the ambient light detection stage. In other words, the control time sequence of the pixel circuit needs to cooperate with a signal time sequence of the control signal end Switch.

Figure 7:
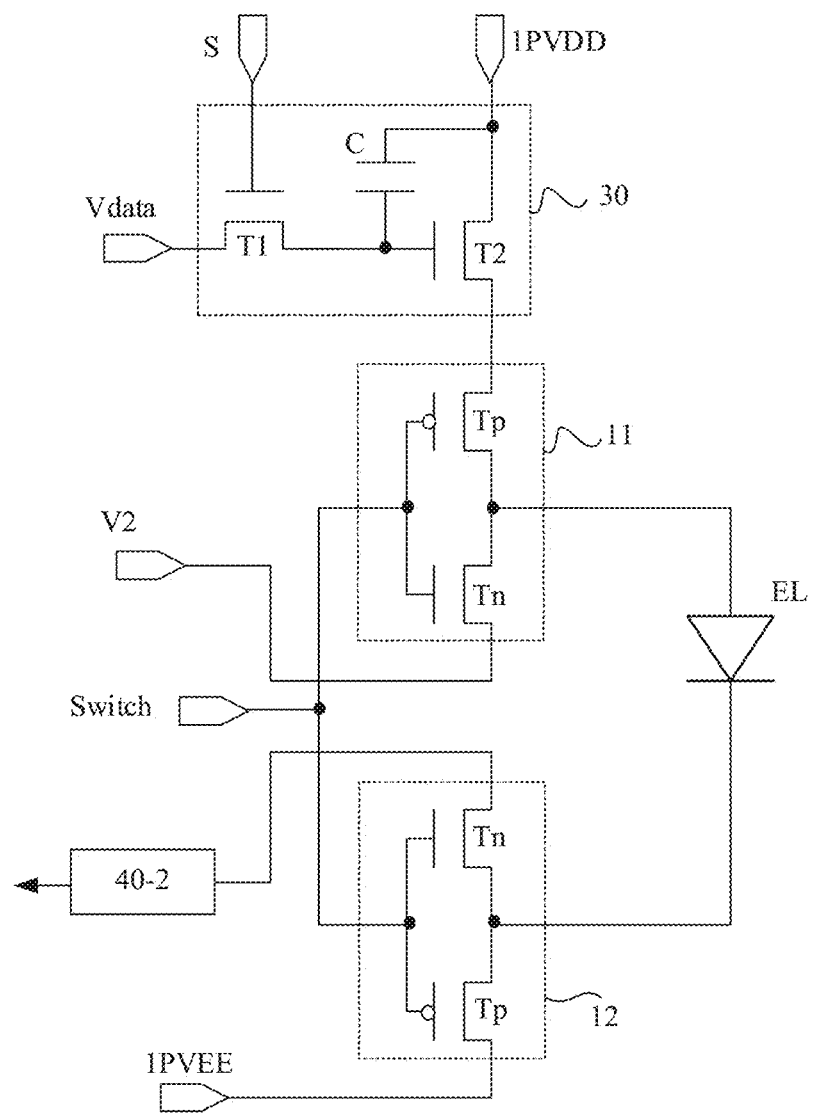
FIG. 7 is a schematic diagram of another optional implementation of a display apparatus according to an embodiment of this application.

In the embodiments in FIG. 1 to FIG. 6, it is shown that the detection circuit is added at the anode of the light emitting device EL, to detect, in the ambient light detection stage, the photo-generated current generated when the light emitting device EL is illuminated. In another embodiment, the detection circuit may alternatively be disposed at the cathode of the light emitting device EL. FIG. 7 is a schematic diagram of another optional implementation of a display apparatus according to an embodiment of this application. As shown in FIG. 7, a first switching unit 11 and a second switching unit 12 are configured to implement switching between a forward bias state and a reverse bias state (or a zero bias state) of a light emitting device EL. A detection circuit 40-2 is disposed at a cathode of the light emitting device EL. The detection circuit 40-2 is connected to the cathode of the light emitting device EL through the second switching unit 12. In an ambient light detection stage, a second detection voltage end V2 is electrically connected to an anode of the light emitting device EL, the detection circuit 40-2 is electrically connected to the cathode of the light emitting device EL, and the second detection voltage end V2 cooperates with the detection circuit 40-2, so that a voltage potential of the anode of the light emitting device EL is less than or equal to a voltage potential of the cathode of the light emitting device EL, so that the light emitting device EL is reverse biased or zero biased. In this case, when the light emitting device EL is illuminated by ambient light, a photo-generated current is generated. In this implementation, a magnitude of the photo-generated current generated by the light emitting device EL is detected by using the detection circuit 40-2 at the cathode of the light emitting device EL. For a working manner in which the first switching unit 11 and the second switching unit 12 are controlled by a control signal end Switch to work, refer to the descriptions in the embodiments in FIG. 1 and FIG. 6, and details are not described herein again.

Figure 8:
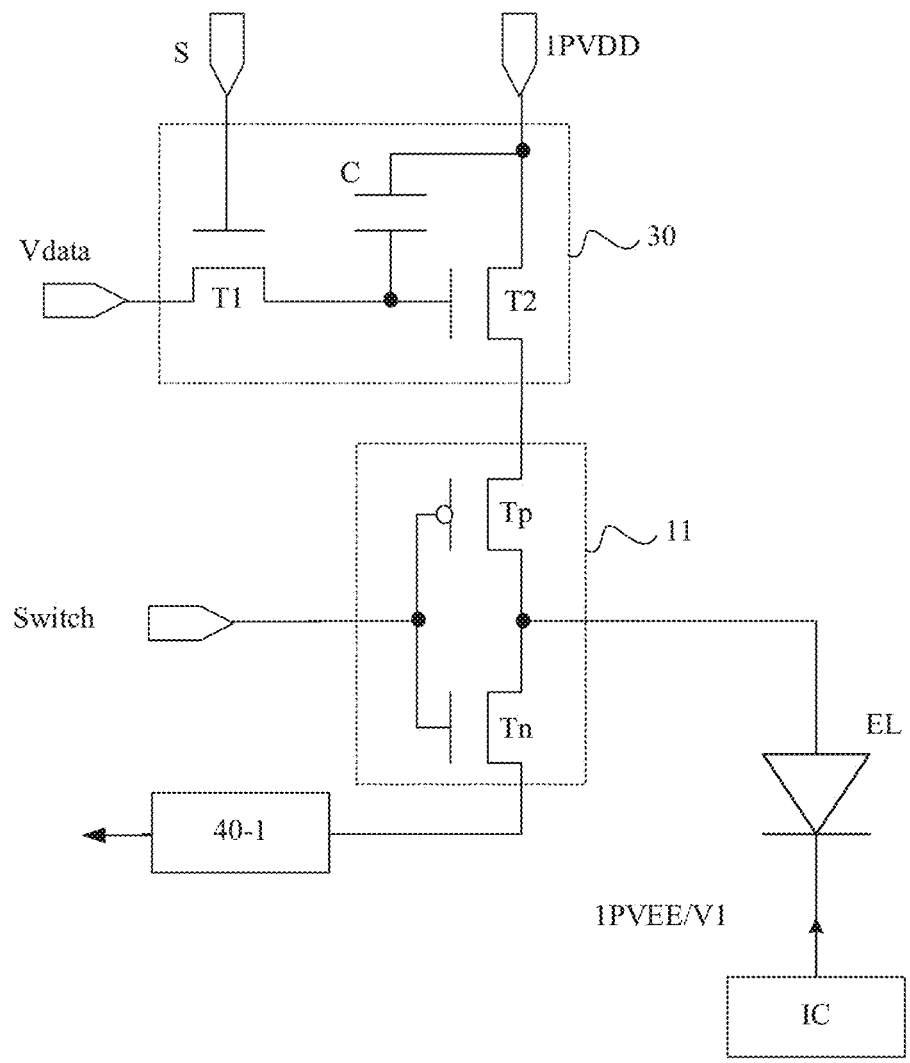
FIG. 8 is a schematic diagram of a circuit structure of another optional implementation of a display apparatus according to an embodiment of this application.

In the embodiments in FIG. 1, FIG. 6, and FIG. 7, it is shown that a switching unit is disposed at both the cathode and the anode of the light emitting device EL, to control the light emitting device EL to switch between a forward bias state and a reverse bias state (or a zero bias state). In another embodiment, a switching unit is disposed only at the anode of the light emitting device EL, and switching of a voltage signal of the cathode of the light emitting device EL is controlled by a drive chip. FIG. 8 is a schematic diagram of a circuit structure of another optional implementation of a display apparatus according to an embodiment of this application. As shown in FIG. 8, output ends of a detection circuit 40-1 and a pixel circuit 30 are electrically connected to an anode of a light emitting device EL through a first switching unit 11, and a control end of the first switching unit 11 is connected to a control signal end Switch. A cathode of the light emitting device EL is connected to a drive chip IC. To be specific, an output end of the drive chip IC provides different voltage signals for the cathode of the light emitting device EL at different stages.

For a diagram of a time sequence of the control signal end Switch, refer to the foregoing schematic diagram in FIG. 2. In a display stage, the control signal end Switch provides a low-level signal, and the output end of a pixel circuit 30 is controlled to connect to the anode of the light emitting device EL. In this case, the drive chip IC provides a light emitting negative voltage signal 1PVEE for the cathode of the light emitting device EL, so that a voltage potential of the anode of the light emitting device EL is greater than a voltage potential of the cathode, and the light emitting device EL is forward biased to perform light emitting display. In an ambient light detection stage, the control signal end Switch provides a high-level signal, and the detection circuit 40-1 is controlled to connect to the anode of the light emitting device EL. In this case, the drive chip IC provides a first detection voltage signal V1 for the cathode of the light emitting device EL, so that a voltage potential of the cathode of the light emitting device EL is greater than or equal to a voltage potential of the anode of the light emitting device EL, and the light emitting device EL is reverse biased or zero biased. The light emitting device EL generates a photo-generated current when illuminated by ambient light. In this case, a magnitude of the photo-generated current passing through the light emitting device EL is detected by using the detection circuit 40-1, to detect the ambient light intensity.

In the embodiment in FIG. 8, only a switching unit needs to be added at the anode of the light emitting device, and a voltage signal at the cathode of the light emitting device is directly controlled by the drive chip. In this implementation, a structure of the display panel is slightly changed, and a manufacturing process is simpler.

Optionally, the cathode of the light emitting device EL in FIG. 6 is connected to 1PVEE. In the display stage, the control signal end Switch provides a low-level signal, and the output end of a pixel circuit 30 is controlled to connect to the anode of the light emitting device EL. The cathode of the light emitting device EL is connected to 1PVEE, so that a voltage potential of the anode of the light emitting device EL is greater than a voltage potential of the cathode, and the light emitting device EL is forward biased to perform light emitting display. In the ambient light detection stage, the control signal end Switch provides a high-level signal, and the detection circuit 40-1 is controlled to connect to the anode of the light emitting device EL, and the cathode of the light emitting device EL is connected to 1PVEE. A voltage of an input end of the detection circuit 40-1 is controlled to be less than or equal to 1PVEE, so that a voltage potential of the cathode of the light emitting device EL is greater than or equal to a voltage potential of the anode of the light emitting device EL, and the light emitting device EL is reverse biased or zero biased. The light emitting device EL generates a photo-generated current when illuminated by ambient light. In this case, a magnitude of the photo-generated current passing through the light emitting device EL is detected by using the detection circuit 40-1, to detect the ambient light intensity.

In the foregoing embodiments in FIG. 1 to FIG. 8, an example in which a light emitting device is multiplexed as a photoelectric detector for ambient light detection is used to describe a circuit connection manner and a working manner. Further, to ensure that a sufficient quantity of signals can be detected for ambient light detection, so as to ensure sensitivity of a function of adjusting display brightness based on ambient light, in this embodiment of this application, a plurality of light emitting devices are designed to be simultaneously used as photoelectric detectors in the ambient light detection stage.

Figure 9:
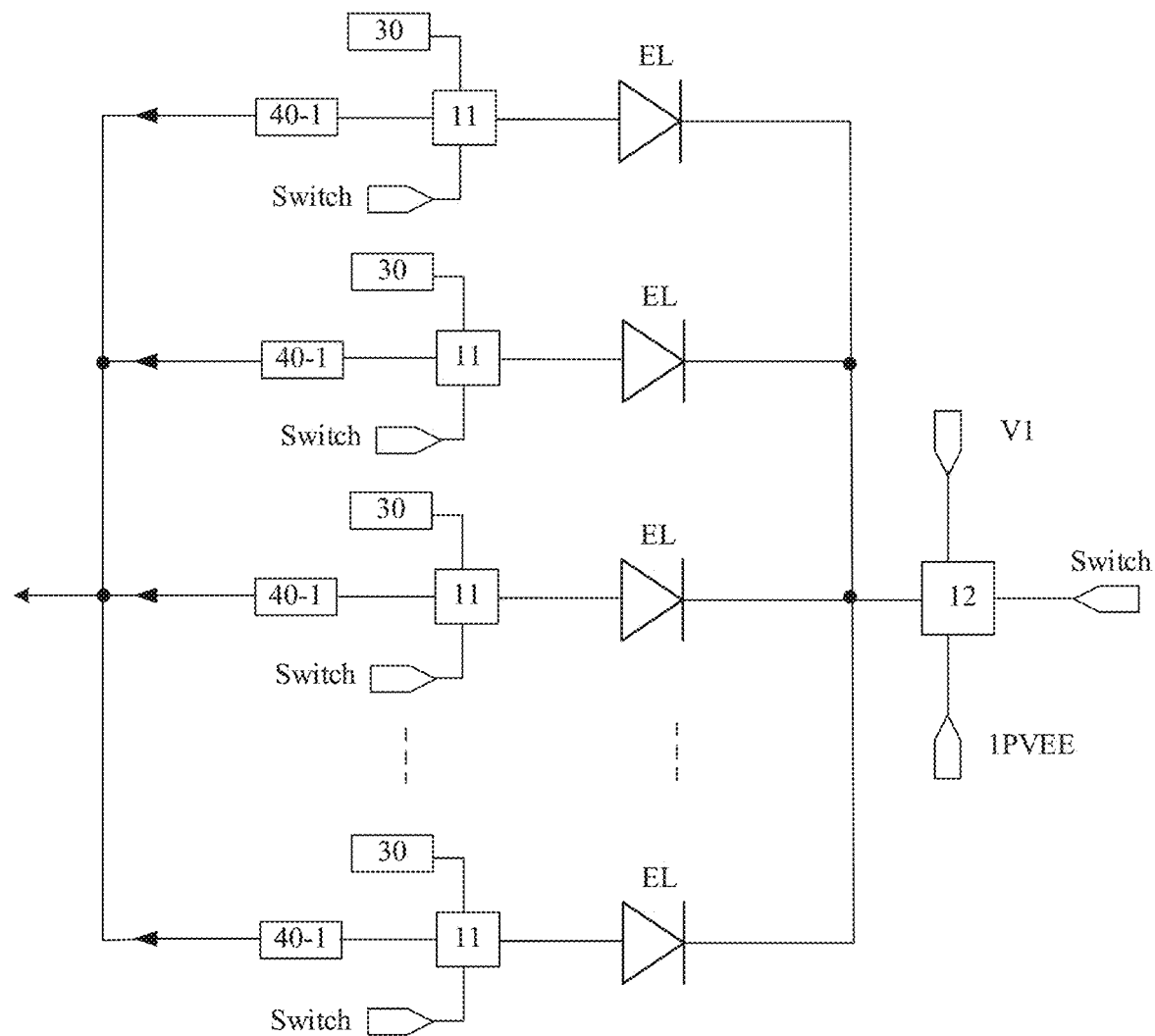
FIG. 9 is a diagram of a circuit structure of another optional implementation of a display apparatus according to an embodiment of this application.

Specifically, in an embodiment, FIG. 9 is a diagram of a circuit structure of another optional implementation of a display apparatus according to an embodiment of this application. As shown in FIG. 9, an anode of a light emitting device EL is electrically connected to a pixel circuit 30 and a detection circuit 40-1 through a first switching unit 11. A cathode of the light emitting device EL is electrically connected to a light emitting negative power end 1PVEE and a first detection voltage end V1 through a second switching unit 12. A control end of the first switching unit 11 and a control end of the second switching unit 12 are both connected to a control signal end Switch. The light emitting negative power end 1PVEE is configured to: provide a voltage signal to cooperate with the pixel circuit 30, and control a voltage signal of the anode of the light emitting device EL to be greater than a voltage signal of the cathode of the light emitting device EL, to control the light emitting device EL to be forward biased. The first detection voltage end V1 cooperates with the detection circuit 40-1, to control a voltage signal of the cathode of the light emitting device EL to be greater than or equal to the voltage signal of the anode of the light emitting device EL, and to control the light emitting device EL to be backward biased or zero biased. In this implementation, one light emitting device EL corresponds to one detection circuit 40-1, and a plurality of detection circuits 40-1 are connected in parallel. In an ambient light detection stage, one detection circuit 40-1 detects a photo-generated current generated when one light emitting device EL is illuminated, that is, one detection circuit 40-1 generates one detection electrical signal. A plurality of detection circuits 40-1 simultaneously provide detected electrical signals to an electrical signal processing module. That is, a quantity of signals received by the electrical signal processing module is a sum of quantities of electrical signals detected by the plurality of detection circuits 40-1, and a quantity of signals actually received by the electrical signal processing module is a sum of quantities of signals generated by the plurality of light emitting devices. In this implementation, the detected quantity of signals can be increased, which is equivalent to increasing sensitivity of the ambient light detection function. When the quantity of signals is large enough, data processing difficulty can also be reduced, and no additional amplification processing needs to be performed on the electrical signal.

Figure 10:
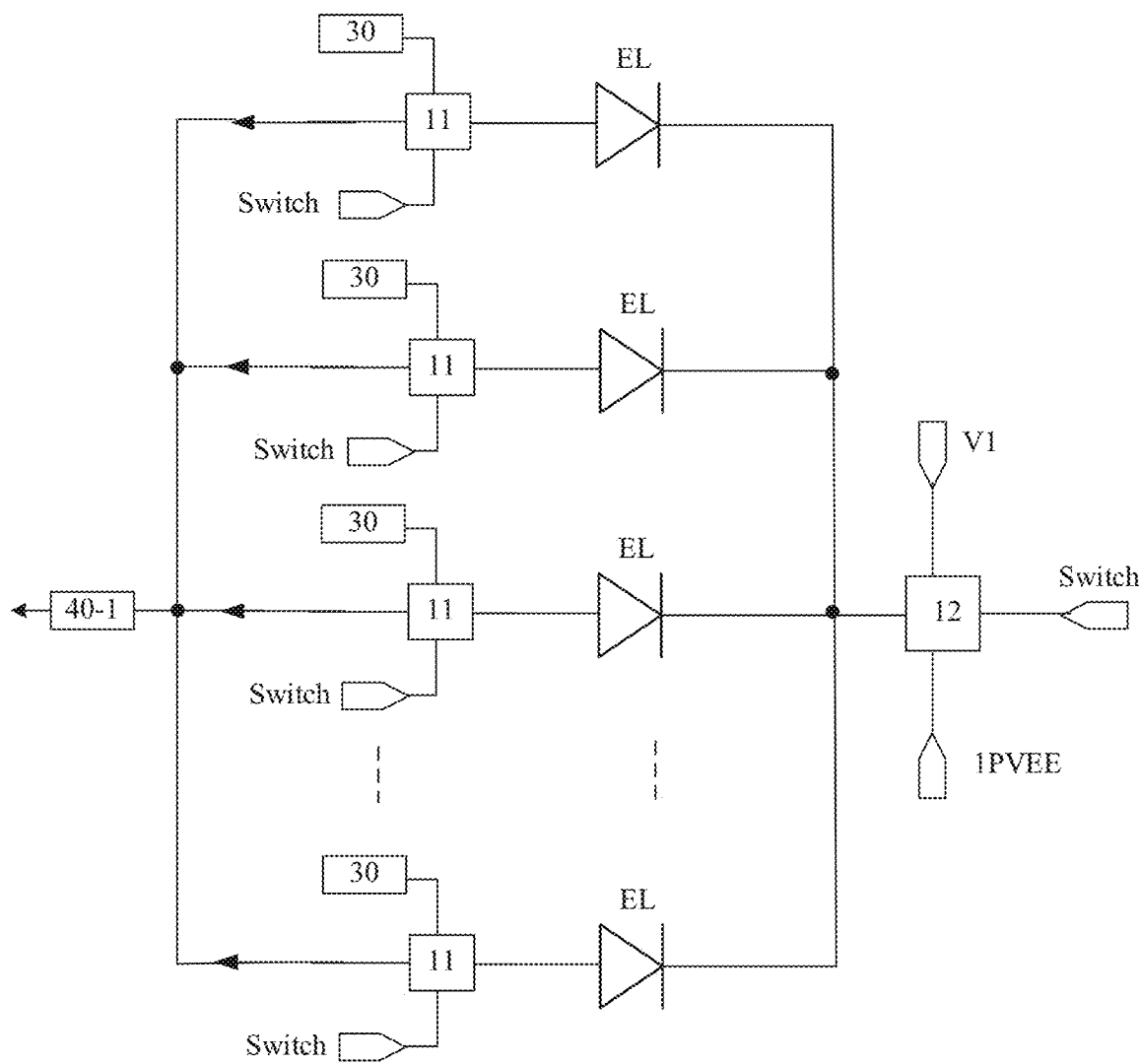
FIG. 10 is a diagram of a circuit structure of another optional implementation of a display apparatus according to an embodiment of this application.

In another implementation, FIG. 10 is a diagram of a circuit structure of another optional implementation of a display apparatus according to an embodiment of this application. Similarly, in an ambient light detection stage, a plurality of light emitting devices are used as photoelectric detectors at the same time. A difference between the embodiment in FIG. 10 and the embodiment in FIG. 9 lies in that, in the embodiment in FIG. 10, one detection circuit 40-1 is used to simultaneously detect photo-generated currents generated by the plurality of light emitting devices ELs when the light emitting devices ELs are illuminated by ambient light, and the detection circuit 40-1 detects a sum of photo-generated currents of the plurality of light emitting devices ELs. Then the detection circuit 40-1 provides a detection electrical signal for an electrical signal processing module for subsequent processing.

In the embodiments in FIG. 9 and FIG. 10, the circuit connection manner in the embodiment in FIG. 1 is used as an example for illustration. In practice, all the embodiments in FIG. 6, FIG. 7, and FIG. 8 may be applied to an implementation in which a plurality of light emitting devices are simultaneously used as photoelectric detectors, and details are not described herein again.

Figure 11:
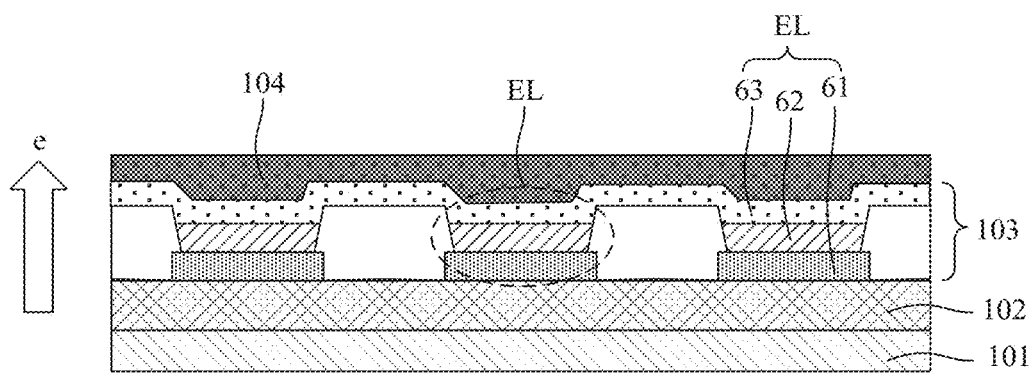
FIG. 11 is a schematic diagram of a film layer structure of a display apparatus according to an embodiment of this application.

Specifically. FIG. 11 is a schematic diagram of a film layer structure of a display apparatus according to an embodiment of this application. As shown in FIG. 11, the display apparatus includes a substrate 101, an array layer 102 located above the substrate, and a light emitting device layer 103 located on a side that is of the array layer 102 and that is away from the substrate 101. The light emitting device layer 103 includes a plurality of light emitting devices ELs, and a pixel circuit is disposed in the array layer 102 to drive the light emitting devices to emit light. In this embodiment of this application, a switching unit and a detection circuit are also located at the array layer. The light emitting device EL includes an anode 61, a function layer 62, and a cathode 63 that are stacked in sequence. An encapsulation protection layer 104 is further disposed above the light emitting device layer 103. In a display apparatus having a touch function, a touch module (not shown in the figure) is further disposed above the light emitting device layer 103. The figure shows a light emitting direction e of the display apparatus. A light emitting direction of the light emitting device in the display apparatus provided in this embodiment of this application is a direction from the anode 61 to the cathode 63. In other words, the light emitting direction e is a direction from the substrate 101 to the light emitting device layer 103. In other words, the side that is of the substrate and that is away from an array substrate is a back side of the display apparatus. The light emitting device may be an organic light emitting diode, or may be an inorganic light emitting diode. Generally, in a display apparatus, anodes 61 of a plurality of light emitting devices ELs are isolated from each other, and cathodes 63 are disposed in an entire layer, that is, cathodes 63 of all light emitting devices ELs are interconnected to form a cathode layer disposed in the entire layer. In a display stage, a voltage signal is provided to the anode 61 through a pixel circuit, and a voltage signal is provided to the cathodes 63 of all the light emitting devices ELs through a cathode signal end.

Figure 12:
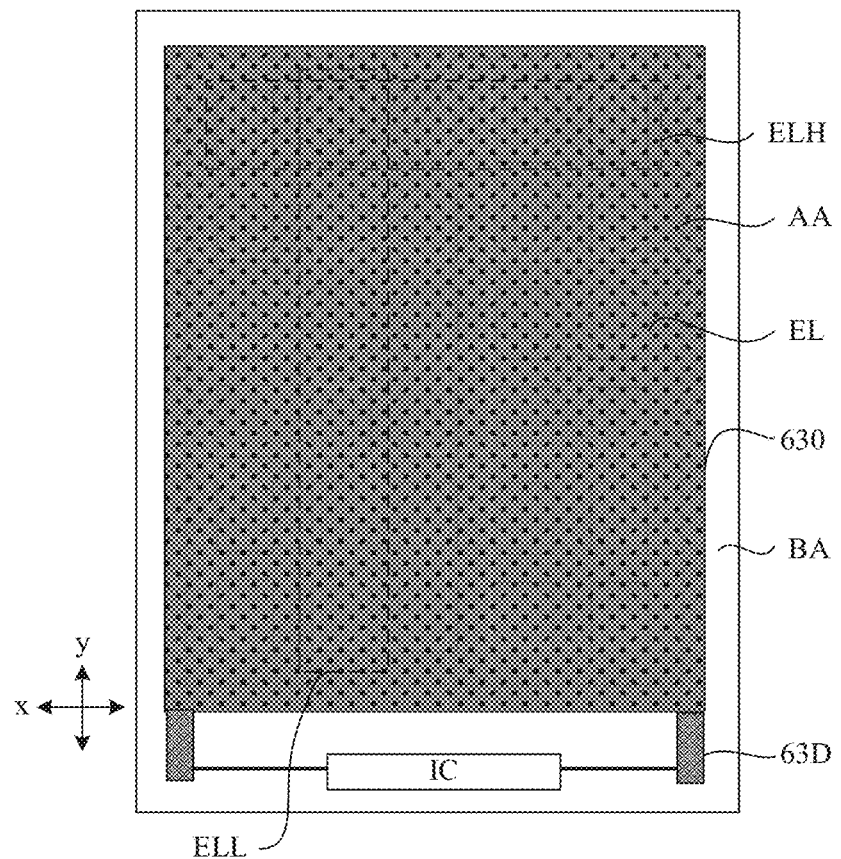
FIG. 12 is a schematic top view of a display apparatus according to an embodiment of this application.

FIG. 12 is a schematic top view of a display apparatus according to an embodiment of this application. As shown in FIG. 12, the display apparatus includes a display area AA and a non-display area BA. Light emitting devices ELs are located in the display area AA. An arrangement manner of the light emitting devices ELs in the figure is merely an example. A cathode layer 630 is further shown in the figure. The cathode layer 630 extends from the display area AA to the non-display area BA, a cathode signal end 63D is disposed in the non-display area, and the cathode signal end 63D is connected to the cathode layer 630 and a drive chip IC, to provide a voltage signal for the cathode layer 630. FIG. 12 is shown by using an example in which the drive chip IC is fastened to the non-display area BA of the display apparatus. In another implementation, the driver chip IC is fastened to a flexible circuit board, and the flexible circuit board is bound to and connected to the display apparatus.

In an embodiment, in an ambient light detection stage, at least some light emitting devices in the display apparatus are multiplexed as photoelectric detectors. It may be understood from the foregoing descriptions in the embodiments in FIG. 1 to FIG. 10 that, a detection circuit for ambient light detection may be disposed at an anode or a cathode of the light emitting device. Regardless of whether the detection circuit is disposed at the anode or the cathode of the light emitting device, a switching unit needs to be disposed at the anode of the light emitting device. One light emitting device corresponds to one switching unit, and the switching unit switches a voltage signal at the anode of the light emitting device in the display stage and the ambient light detection stage.

A switching unit may be disposed at the negative end, and the switching unit switches a voltage signal at the cathode of the light emitting device in different stages. Refer to a schematic diagram in FIG. 12. Because the cathode layer is an entire layer, the switching unit may be disposed between the cathode signal end 63D and the drive chip IC. The second switching unit 12 connected to the cathode of the light emitting device EL in the embodiment in FIG. 1 is used as an example. The light emitting negative power end 1PVEE and the first detection voltage end V1 need to be respectively corresponding to different output ports of the drive chip IC. Optionally, when 1PVEE and V1 have a same voltage, 1PVEE and V1 may be directly connected to a same output port of the drive chip IC.

Alternatively, no switching unit is disposed at the cathode, and different voltage signals are separately provided to the cathode layer 630 in different stages through a same output port of the drive chip IC. In this manner, a connection manner between the cathode signal end and the drive chip does not need to be changed, and a structure is simple.

In another embodiment, in the display apparatus, only some light emitting devices are time-division-multiplexed and are configured to emit light in a display stage, and some light emitting devices are multiplexed as photoelectric detectors in an ambient light detection stage. As shown in FIG. 12, the plurality of light emitting devices ELs form a light emitting device array in the display area AA. The light emitting device array includes a plurality of light emitting device rows ELH and a plurality of light emitting device columns ELL. The plurality of light emitting devices ELs in the light emitting device rows ELH are arranged in a first direction x, and the plurality of light emitting devices ELs in the light emitting device columns ELL are arranged in a second direction y. The first direction x overlaps the second direction y. In an optional implementation, one or more light emitting device columns ELLs in the light emitting device array are multiplexed as one or more photoelectric detectors in the ambient light detection stage. In another optional implementation, one or more light emitting device rows ELHs in the light emitting device array are multiplexed as one or more photoelectric detectors in the ambient light detection stage.

Further, an embodiment of this application further provides a drive chip, and the drive chip includes a processing module and a brightness control module. The processing module is configured to: receive an ambient light detection signal, analyze the ambient light detection signal to obtain an ambient light intensity signal, and send a processing result to the brightness control module. The brightness control module generates a brightness control signal based on the processing result, to match image display brightness with ambient light brightness.

The foregoing embodiment describes an implementation in which the light emitting device is time-division-multiplexed in the display stage and the ambient light detection stage. Based on a same inventive concept, in some implementations, some light emitting devices in the light emitting device array are still used as photoelectric detectors, but the some light emitting devices are only used for ambient light detection, and are not used for light emitting display. The display apparatus includes a first light emitting device and a second light emitting device. The first light emitting device is configured to be reverse biased or zero biased for ambient light detection, and the second light emitting device is configured to be forward biased for light emitting display. That is, the first light emitting device works in the ambient light detection stage, and the second light emitting device works in the display stage. In an implementation, ambient light detection and display are performed at different moments. In another implementation, ambient light detection and display are performed simultaneously.

Figure 13:
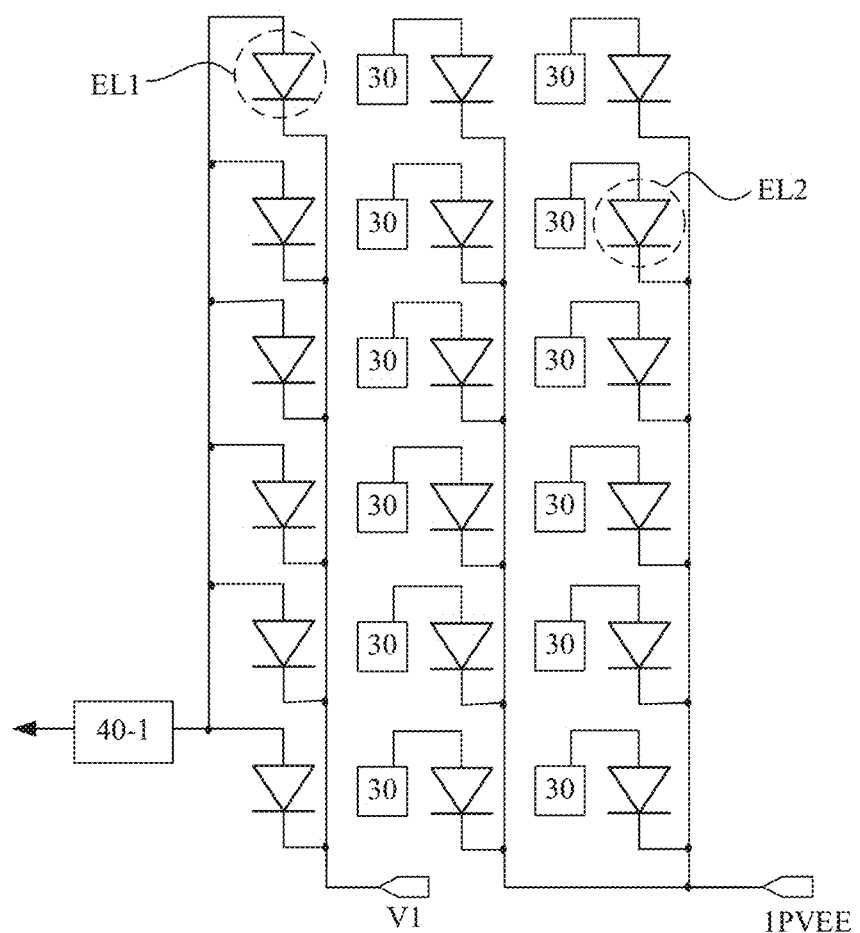
FIG. 13 is a diagram of a circuit structure of another optional implementation of a display apparatus according to an embodiment of this application.

FIG. 13 is a diagram of a circuit structure of another optional implementation of a display apparatus according to an embodiment of this application. FIG. 13 shows that the display apparatus includes a first light emitting device EL1 and a second light emitting device EL2. An anode of the first light emitting device EL1 is electrically connected to a detection circuit 40-1. A cathode of the first light emitting device EL1 is electrically connected to a first detection voltage end V1. That is, the detection circuit 40-1 is disposed at the anode of the first light emitting device EL. In an ambient light detection stage, the first light emitting device EL1 is reverse biased or zero biased, and the first light emitting device EL1 is used as a photoelectric detector for ambient light detection. An anode of the second light emitting device EL2 is electrically connected to a pixel circuit 30, and a cathode of the second light emitting device EL2 is electrically connected to a light emitting negative power end 1PVEE. In a display stage, the second light emitting device EL2 is forward biased for light emitting display. For structures of the pixel circuit 30 and the detection circuit 40-1, refer to the descriptions in the foregoing corresponding embodiments, and details are not described herein again. The first light emitting device and the second light emitting device are formed simultaneously in a light emitting device array process, that is, a structure of the first light emitting device is the same as a structure of the second light emitting device. Because the first light emitting device is not configured to emit light, a pixel circuit does not need to be disposed in the array layer to be connected to the first light emitting device, so that a quantity of pixel circuits in the array layer can be reduced.

Figure 14:
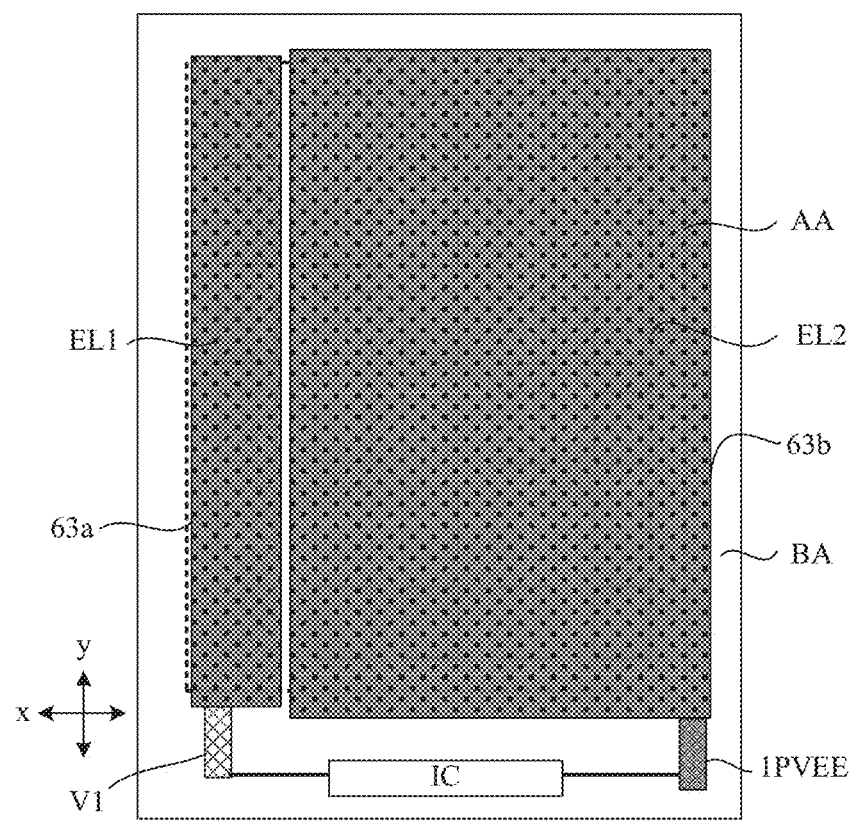
FIG. 14 is a schematic top view of another optional implementation of a display apparatus according to an embodiment of this application.

In the embodiment in FIG. 13, the cathode of the first light emitting device EL1 and the cathode of the second light emitting device EL2 need to be connected to different voltage ends, that is, the cathode of the first light emitting device EL1 and the cathode of the second light emitting device EL2 need to be insulated from each other. Therefore, the cathode layer in the display apparatus provided in the embodiment in FIG. 13 is not disposed in an entire layer. FIG. 14 is a schematic top view of another optional implementation of a display apparatus according to an embodiment of this application. As shown in FIG. 14, an example in which a first light emitting device EL1 is located at an edge of a light emitting device array is used, that is, the first light emitting device EL1 is adjacent to a non-display area BA. A cathode layer of the display apparatus includes a first cathode part 63a and a second cathode part 63b, where cathodes of a plurality of first light emitting devices EL1 are connected to each other to form the first cathode part 63a, and cathodes of a plurality of second light emitting devices EL2 are connected to each other to form the second cathode part 63b. A first detection voltage end V1 and a light emitting negative power end 1PVEE are disposed in the non-display area BA of the display apparatus. The first cathode portion 63a is electrically connected to a drive chip IC through the first detection voltage end V1, and the second cathode portion 63b is electrically connected to the drive chip IC through the light emitting negative power end 1PVEE. The drive chip IC provides a voltage signal for the cathode of the first light emitting device EL1 and the cathode of the second light emitting device EL2 through different output ports. In this implementation, a display stage and an ambient light detection stage do not interfere with each other.

Figure 15:
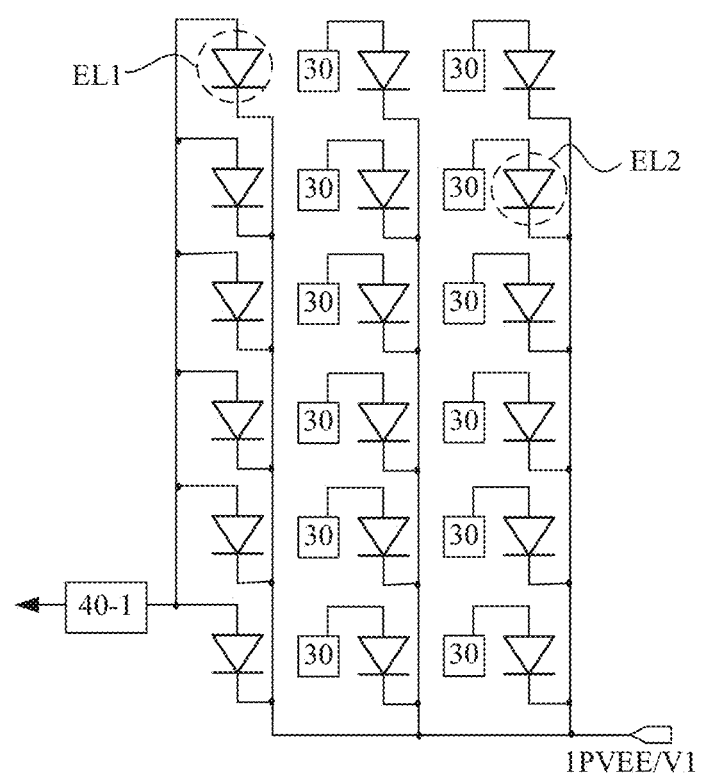
FIG. 15 is a diagram of a circuit structure of another optional implementation of a display apparatus according to an embodiment of this application.

In another embodiment, FIG. 15 is a diagram of a circuit structure of another optional implementation of a display apparatus according to an embodiment of this application. A difference from the embodiment in FIG. 14 lies in that, in the embodiment in FIG. 15, a cathode of a first light emitting device EL1 and a cathode of a second light emitting device EL2 are electrically connected to a same voltage port 1PVEE/V1, that is, one voltage port provides voltage signals for the cathode of the first light emitting device EL1 and the cathode of the second light emitting device EL2. A drive chip controls to provide different voltage signals to the voltage port 1PVEE/V1 in a display stage and an ambient light detection stage. In this setting manner, a structure of the cathode layer does not need to be changed. Optionally, 1PVEE may be the same as V1.

In the embodiments in FIG. 13 and FIG. 15, it is shown that a detection circuit is disposed at an anode of the first light emitting device, and the detection circuit is electrically connected to the anode of the first light emitting device. In another embodiment, a detection circuit may further be disposed at the cathode of the first light emitting device, and the detection circuit is eclectically connected to the cathode of the first light emitting device, which is not illustrated herein.

In addition, in the embodiments in FIG. 13 and FIG. 15, it is shown that anodes of a plurality of first light emitting devices are electrically connected to a same detection circuit. In the ambient light detection stage, the detection circuit detects a sum of photo currents generated by the plurality of first light emitting devices. In another embodiment, one first light emitting device is corresponding to one detection circuit, and then electrical signals of the detection circuit are superposed and then provided for an electrical signal processing module for subsequent processing.

Figure 16:
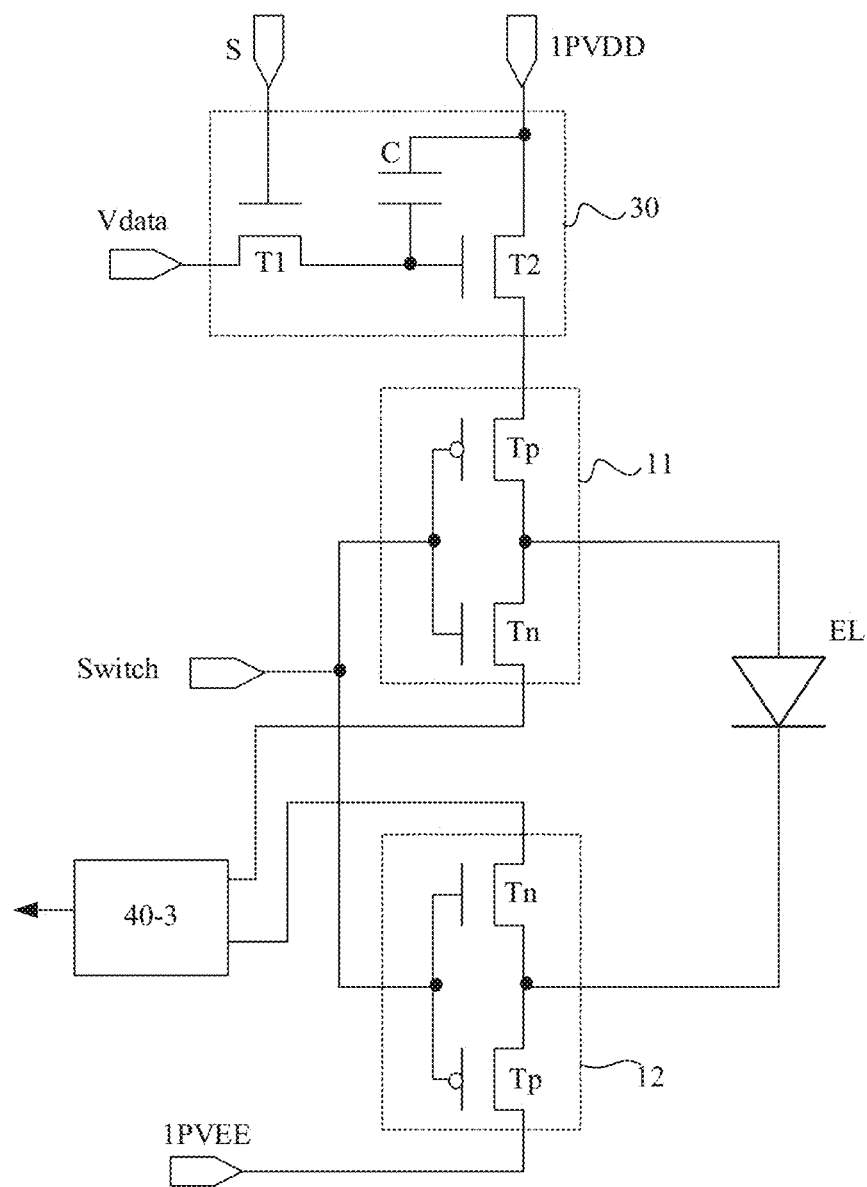
FIG. 16 is a diagram of a circuit structure of another optional implementation of a display apparatus according to an embodiment of this application.

In the foregoing embodiments, the light emitting device is used as a photoelectric detector, and the detection circuit is connected to the anode of the light emitting device to perform ambient light detection, or the detection circuit is connected to the cathode of the light emitting device to perform ambient light detection. In another embodiment, FIG. 16 is a diagram of a circuit structure of another optional implementation of a display apparatus according to an embodiment of this application. A detection circuit 40-3 is a differential detection circuit, and an anode of a light emitting device EL is electrically connected to a first input end of the detection circuit 40-3 and an output end of a pixel circuit 30 through a first switching unit 11. A cathode of the light emitting device EL is electrically connected to a second input end of the detection circuit 40-3 and a light emitting cathode power end 1PVEE through a second switching unit 12. In addition, a control end of the first switching unit 11 and a control end of the second switching unit 12 are both electrically connected to a control signal end Switch. Refer to the diagram of the time sequence shown in FIG. 2 for understanding. In a display stage t1, the control signal end provides a first control signal. The first switching unit 11 controls, under control of the first control signal, the output end of the pixel circuit 30 to connect to the anode of the light emitting device EL. The second switching unit 12 controls, under control of the first control signal, the light emitting negative power end 1PVEE to connect to the cathode of the light emitting device EL. In the display stage t1, the light emitting device EL is forward biased, and the light emitting device EL can be used for emitting light. In an ambient light detection phase t2, the control signal end Switch provides a second control signal. The first switching unit 11 controls, under control of the second control signal, the anode of the light emitting device EL to be electrically connected to the first input end of the detection circuit 40-3. The second switching unit 12 controls, under control of the second control signal, the cathode of the light emitting device EL to be electrically connected to the second input end of the detection circuit 40-3. In the ambient light detection stage t2, the anode and the cathode of the light emitting device EL are both connected to the detection circuit 40-3.

The detection circuit 40-3 is any differential circuit in a current technology, and a specific circuit structure is not illustrated herein. After the light emitting device EL is illuminated by ambient light to generate a photo-generated current, the detection circuit 40-3 is configured to convert the photo-generated current generated by the light emitting device EL into a voltage signal.

FIG. 16 shows an embodiment in which a differential detection circuit is used as a detection circuit in an implementation in which a light emitting device is multiplexed as a photoelectric detector. Embodiments in FIG. 13 to FIG. 15 are embodiments in which the light emitting device in the light emitting device layer is used only as the photoelectric detector. In an implementation in which the light emitting device in the light emitting device layer is used only as the photoelectric detector, and is not used for light emitting, the detection circuit may also be set as a differential detection circuit. Specifically, the anode and the cathode of the first light emitting device are disposed to be electrically connected to the differential detection circuit, and are configured to detect, in the ambient light detection stage, the photo-generated current generated by the first light emitting device.

Figure 17:
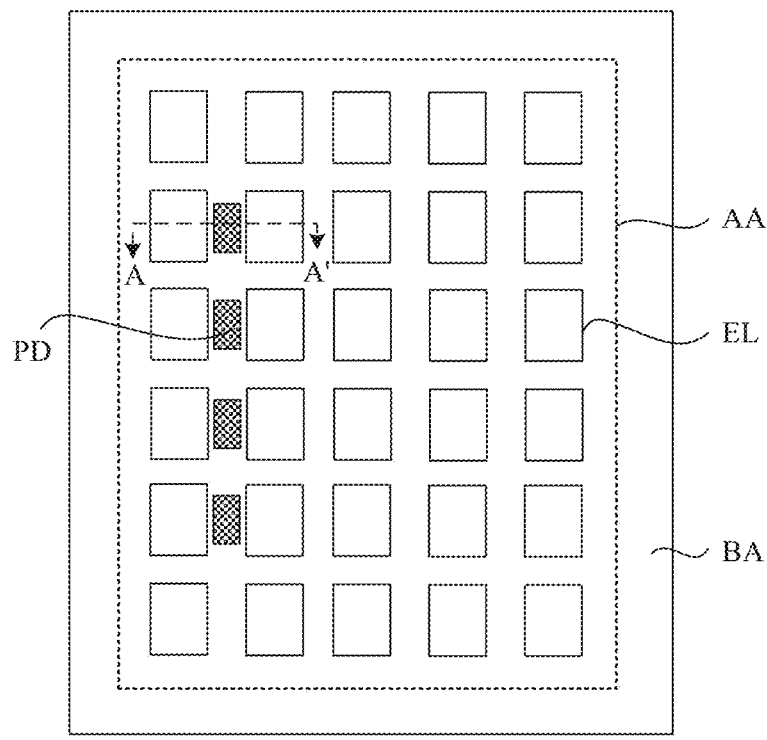
FIG. 17 is another schematic top view of a display apparatus according to an embodiment of this application.
Figure 18:
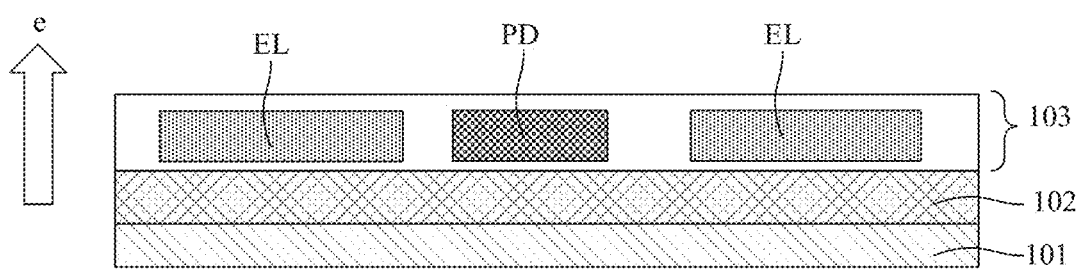
FIG. 18 is a schematic diagram of a cross section at a position of a cutting line A-A' in FIG. 17.

In another embodiment, the photoelectric detector is located between adjacent light emitting devices in a pixel array. FIG. 17 is another schematic top view of a display apparatus according to an embodiment of this application. FIG. 18 is a schematic diagram of a cross section at a position of a cutting line A-A' in FIG. 17. As shown in FIG. 17, a display area AA includes a photoelectric detector PD. In an ambient light detection stage, the photoelectric detector PD is configured to be reverse biased or zero biased, to detect an ambient light intensity. The photoelectric detector PD is located between two adjacent light emitting devices EL, where the light emitting device EL may be an organic light emitting diode or an inorganic light emitting diode. FIG. 18 shows a film layer position of a photoelectric detector PD in a display panel. The display panel includes a substrate 101, an array layer 102, and a light emitting device layer 103. The photoelectric detector PD is located at the light emitting device layer 103, that is, the photoelectric detector and a light emitting device EL are located at a same layer. When the display panel is manufactured, the photoelectric detector and the light emitting device are manufactured in a same process. The photoelectric detector PD and the light emitting device EL in FIG. 18 are only simplified examples. The figure further shows a light emitting direction e of the display panel, where the light emitting direction e is a direction from the substrate 101 to the light emitting device layer 103. In this implementation, the photoelectric detector is disposed above the substrate, and ambient light needs to penetrate only a part of a film layer structure of the display panel to be received by the photoelectric detector. Therefore, a light loss of the ambient light is small, and a requirement on a light sensing threshold of the photoelectric detector is reduced, so that costs of implementing an ambient light detection function can be reduced. In addition, the ambient light sensor does not need to be additionally attached to the back of the display panel provided in this embodiment, so that module assembly complexity can be reduced, and a module thickness can be reduced.

Figure 19:
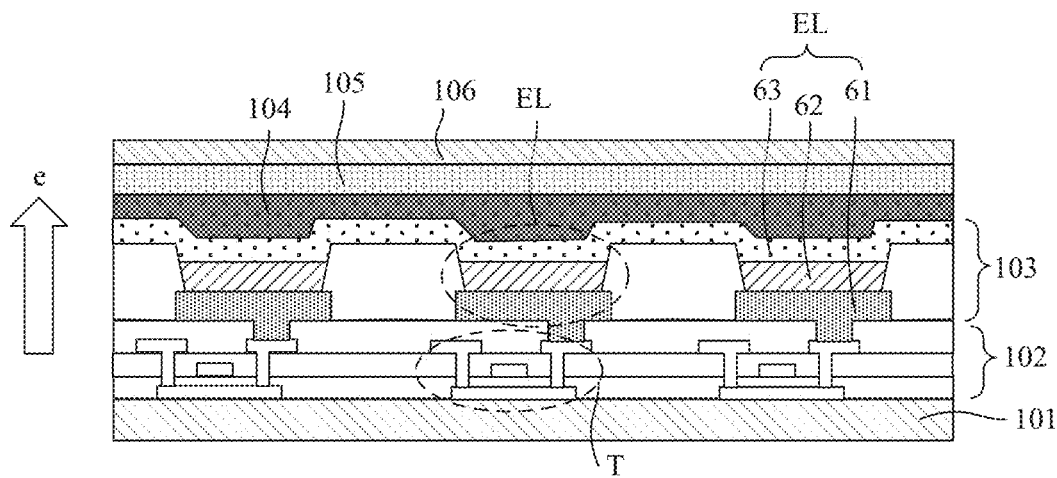
FIG. 19 is a schematic diagram of another film layer structure of a display apparatus according to an embodiment of this application.

In another embodiment, the photoelectric detector is located on a side that is of the light emitting device layer and that is away from the substrate. FIG. 19 is a schematic diagram of another film layer structure of a display apparatus according to an embodiment of this application. As shown in FIG. 19, a display panel includes a substrate 101, an array layer 102, and a light emitting device layer 103. The light emitting device layer 103 includes a plurality of light emitting devices ELs. The light emitting device EL includes an anode, a function layer, and a cathode that are stacked in sequence. The anode is a metal anode, the cathode is a transparent cathode, and light emitted by the light emitting device is finally emitted by the cathode. The array layer 102 includes a pixel circuit. A transistor T in the pixel circuit is shown in the figure. A drain of the transistor T is electrically connected to the anode of the light emitting device EL. The figure further shows a photoelectric detection layer 105. The photoelectric detection layer 105 is located on a side that is of the light emitting device layer 103 and that is away from the substrate 101, and the photoelectric detection layer 105 is of a PN junction structure or a PIN junction structure. The photoelectric detection layer 105 is configured to detect ambient light in an ambient light detection stage. The display panel further includes an encapsulation protection layer 104. The encapsulation protection layer 104 is located between the light emitting device layer 103 and the photoelectric detection layer 105. The encapsulation protection layer 104 can perform encapsulation protection on the light emitting device EL in the light emitting device layer 103, and can also perform an insulation function between the light emitting device layer 103 and the photoelectric detection layer 105, to avoid interference between the light emitting device EL and the photoelectric detection layer 105. In addition, the display panel further includes a protective cover 106, and the protective cover 106 protects the film layer structure inside the display panel.

Further, based on the embodiment in FIG. 19, the photoelectric detection layer is provided with a plurality of openings, and one opening corresponds to one light emitting device. During display, light emitted by the light emitting device penetrates the photoelectric detection layer through the opening, to reduce a light loss and improve display brightness.

The display apparatus provided in the embodiments in FIG. 17 to FIG. 19 further includes a detection circuit, where the detection circuit is configured to detect, in the ambient light detection stage, a photo-generated current generated by the photoelectric detector, and the detection circuit is connected to an anode of the photoelectric detector, and/or is connected to a cathode of the photoelectric detector. When the detection circuit is separately connected to the anode and the cathode of the photoelectric detector, the detection circuit is a differential detection circuit.

Figure 20:
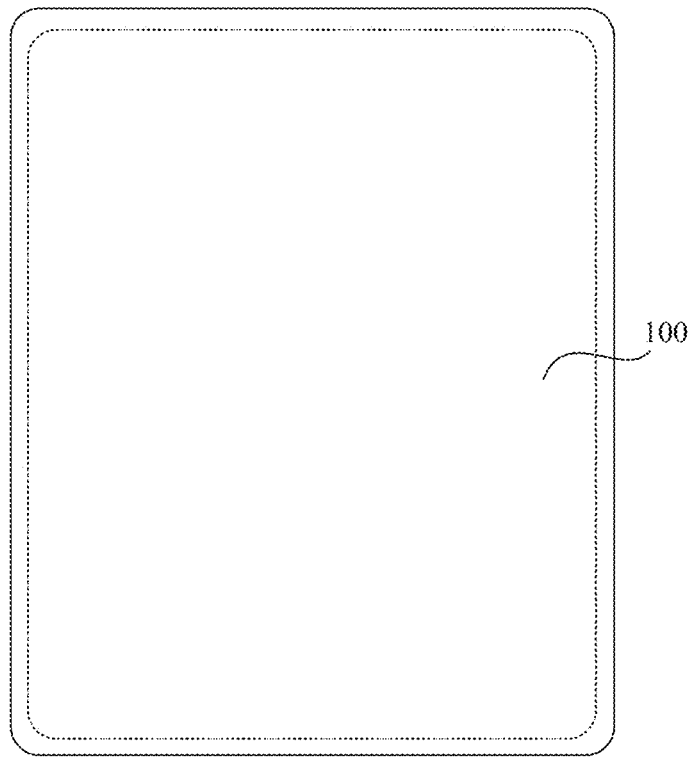
FIG. 20 is a schematic diagram of an electronic device according to an embodiment of this application.

An embodiment of this application further provides an electronic device. FIG. 20 is a schematic diagram of an electronic device according to an embodiment of this application. As shown in FIG. 20, the electronic device includes a display apparatus 100 provided in any embodiment of this application. A specific structure of the display apparatus 100 is described in detail in the foregoing embodiments, and details are not described herein again. It is clear that, the electronic device shown in FIG. 20 is merely an example for description, and may be, for example, any electronic device, such as a mobile phone, a tablet computer, a notebook computer, an e-book, a television, or a smartwatch, that has a display function.

The foregoing descriptions are merely example embodiments of the present invention, but are not intended to limit the present invention. Any modification, equivalent replacement, or improvement made without departing from the spirit and principle of the present invention shall fall within the protection scope of the present invention.

Finally, it should be noted that the foregoing embodiments are merely intended for describing the technical solutions of the present invention, but not for limiting the present invention. Although the present invention is described in detail with reference to the foregoing embodiments, persons of ordinary skill in the art should understand that they may still make modifications to the technical solutions described in the foregoing embodiments or make equivalent replacements to some or all technical features thereof without departing from the scope of the technical solutions of embodiments of the present invention.

What is claimed is:

1. An apparatus, comprising:
a substrate comprising a first side;
a display surface on the first side;
a light emitting device layer on the first side and between the substrate and the display surface;
first light emitting diodes within the light emitting device layer and configured to display an image;
second light emitting diodes within the light emitting device layer and comprising a photoelectric detector, wherein the photoelectric detector comprises a PN junction or a PIN junction, and wherein when the photoelectric detector is reverse biased or zero biased, the photoelectric detector is configured to:
generate a photo-generated current under illumination of ambient light; and
detect, based on the photo-generated current, ambient light information; and
a switching device coupled to the photoelectric detector and configured to:
control the photoelectric detector to be reverse biased or zero biased when the apparatus works in an ambient light detection stage; and
control the photoelectric detector to be forward biased when the apparatus works in a display stage.

2. The apparatus of claim 1, wherein when the apparatus works in the display stage, the second light emitting diodes are configured to be forward biased for emitting light, and wherein when the apparatus works in the ambient light detection stage, at least one of the second light emitting diodes is configured to:
be multiplexed as the photoelectric detector; and
be reversed biased or zero biased to generate the photo-generated current under illumination of the ambient light and detect, based on the photo-generated current, the ambient light information.

3. The apparatus of claim 2, wherein the apparatus further comprises a detection circuit, wherein the detection circuit is either connected to an anode of the at least one of the second light emitting diodes through the switching device or connected to a cathode of the at least one of the second light emitting diodes through the switching device, and wherein the detection circuit is configured to detect, in the ambient light detection stage, the photo-generated current.

4. The apparatus of claim 3, wherein the switching device comprises a first switching component and a second switching component, wherein the anode is connected to the detection circuit and a light emitting anode power end through the first switching component, wherein the cathode is connected to a light emitting cathode power end and a first detection voltage end through the second switching component, wherein when the apparatus works in the display stage, the first switching component is configured to control the anode to connect to the light emitting anode power end, the second switching circuit is configured to control the cathode to connect to the light emitting cathode power end, and the at least one of the second light emitting diodes is configured to be forward biased, and wherein when the apparatus works in the ambient light detection stage, the first switching unit is configured to control the anode to connect to the detection circuit, the second switching component is configured to control the cathode to connect to the first detection voltage end, and the at least one of the second light emitting diodes is configured to be reverse biased or zero biased.

5. The apparatus of claim 3, wherein the switching device comprises a first switching component and a second switching component, wherein the anode is connected to a light emitting anode power end and a second detection voltage end through the first switching component, wherein the cathode is connected to a light emitting cathode power end and the detection circuit through the second switching component, wherein when the apparatus works in the display stage, the first switching component is configured to control the anode to connect to the light emitting anode power end, the second switching component is configured to control the cathode to connect to the light emitting cathode power end, and the at least one of the second light emitting diodes is configured to be forward biased, and wherein when the apparatus works in the ambient light detection stage, the first switching component is configured to control the anode to connect to the second detection voltage end, the second switching component is configured to control the cathode to connect to the detection circuit, and the at least one of the second light emitting diodes light emitting device is configured to be reverse biased or zero biased.

6. The apparatus of claim 3, wherein the switching device comprises a first switching component and a second switching component, wherein the detection circuit is a differential detection circuit, wherein the anode is connected to the differential detection circuit and a light emitting anode power end through the first switching component, wherein the cathode is connected to a light emitting cathode power end and the differential detection circuit through the second switching component, wherein when the apparatus works in the display stage, the first switching component is configured to control the anode to connect to the light emitting anode power end, the second switching component is configured to control the cathode to connect to the light emitting cathode power end, and the at least one of the second light emitting diodes is configured to be forward biased, and wherein when the apparatus works in the ambient light detection stage, the first switching component is configured to control the anode to connect to the differential detection circuit, the second switching unit is configured to control the cathode to connect to the differential detection circuit, and the at least one of the second light emitting diodes is configured to be reverse biased or zero biased.

7. The apparatus of claim 3, wherein the switching device comprises a first switching component, wherein the anode is connected to a light emitting anode power end and a second detection voltage end through the first switching component, wherein the cathode is connected to a light emitting cathode power end, wherein when the apparatus works in the display stage, the first switching component is configured to control the anode to connect to the light emitting anode power end, and the at least one of the second light emitting diodes is configured to be forward biased, and wherein when the apparatus works in the ambient light detection stage, the first switching component is configured to control the anode to connect to the second detection voltage end and configured to control a first voltage value provided by the second detection voltage end to be less than or equal to a second voltage value provided by the light emitting cathode power end, and the at least one of the second light emitting diodes is configured to be reverse biased or zero biased.

8. The apparatus of claim 3, further comprising:
an array layer located between the substrate and the light emitting device layer, wherein both the detection circuit and the switching device are located at the array layer; and
a drive chip electrically connected to a first control end of the detection circuit and a second control end of the switching device, wherein the drive chip is configured to:
provide a control signal for the second control end to switch the at least one of the second light emitting diodes between forward bias and reverse bias or zero bias;
receive the photo-generated current detected by the detection circuit;
process the photo-generated current to obtain ambient light intensity information of the ambient light information; and
control, based on the ambient light intensity information, a display brightness of the apparatus.

9. The apparatus of claim 1, wherein the second light emitting diodes comprise a first light emitting device and a second light emitting device, wherein the first light emitting device is the photoelectric detector, wherein when the apparatus works in the ambient light detection stage, the first light emitting device is configured to be reverse biased or zero biased to generate the photo-generated current and detect the ambient light information, and wherein when the apparatus works in the display stage, the second light emitting device is configured to be forward biased for emitting light.

10. The apparatus of claim 1, wherein the photoelectric detector is located between two adjacent light emitting diodes from the first light emitting diodes.

11. The apparatus of claim 1, wherein the photoelectric detector is located on a second side of the light emitting device layer that is away from the substrate.

12. The apparatus of claim 9, further comprising a detection circuit, wherein the detection circuit is configured to detect, in the ambient light detection stage, the photo-generated current, and wherein the detection circuit is connected to an anode of the photoelectric detector or a cathode of the photoelectric detector.

13. The apparatus of claim 3, further comprising a processor and a brightness controller, wherein the detection circuit is further configured to:
convert the photo-generated current into an electrical signal; and
send the electrical signal to the processor for processing, wherein the processor is configured to:
process the electrical signal to obtain a processing result; and
send the processing result to the brightness controller, and
wherein the brightness controller is configured to control, based on the processing result, a display brightness of the apparatus.

14. A method, comprising:
generating, by first light emitting diodes within a light emitting device layer, an image;
detecting, by second light emitting diodes with the light emitting device layer, ambient light information in an ambient light detection stage by controlling a photoelectric detector in the second light emitting diodes to be reverse biased or zero biased when an apparatus works in the ambient light detection stage, wherein when the photoelectric detector is reverse biased or zero biased:
generating a photo-generated current under illumination of ambient light; and
detecting, based on the photo-generated current, the ambient light information; and
controlling the photoelectric detector to be forward biased when the apparatus works in a display stage.

15. The method of claim 14, further comprising:
providing a control signal to switch between forward bias and reverse bias or zero bias;
receiving the photo-generated current;
processing the photo-generated current to obtain ambient light intensity information of the ambient light information; and
controlling, based on the ambient light intensity information, a display brightness.

16. The method of claim 14, further comprising:
converting the photo-generated current into an electrical signal;
processing the electrical signal to obtain a processing result; and
controlling, based on the processing result, display brightness.

17. The method of claim 16, wherein controlling the display brightness comprises controlling the light emitting device layer comprising the second light emitting diodes.

18. A non-transitory computer readable medium comprising instructions that, when executed by one or more processors, cause an apparatus to:
generate, by first light emitting diodes within a light emitting device layer, an image;
detect, by second light emitting diodes with the light emitting device layer, ambient light information in an ambient light detection stage by controlling a photoelectric detector in the second light emitting diodes to be reverse biased or zero biased when the apparatus works in the ambient light detection stage, wherein when the photoelectric detector is reverse biased or zero biased:
generate a photo-generated current under illumination of ambient light; and
detect, based on the photo-generated current, the ambient light information; and
control the photoelectric detector to be forward biased when the apparatus works in a display stage.

19. The apparatus of claim 1, wherein the first light emitting diodes and the second light emitting diodes are organic light emitting diodes.

20. The apparatus of claim 1, wherein the first light emitting diodes and the second light emitting diodes are micro light emitting diodes.

* * * * *

UNITED STATES PATENT AND TRADEMARK OFFICE
CERTIFICATE OF CORRECTION

PATENT NO. : 12,300,154 B2
APPLICATION NO. : 18/253108
DATED : May 13, 2025
INVENTOR(S) : Sulin Yang and Yapeng Li It is certified that error appears in the above-identified patent and that said Letters Patent is hereby corrected as shown below:

In the Claims

Claim 5, Column 26, Line 40: "second light emitting diodes light emitting device is configured" should read "second light emitting diodes is configured"

Signed and Sealed this
Seventeenth Day of June, 2025

Coke Morgan Stewart
*Acting Director of the United States Patent and Trademark Office*